(12) United States Patent
Yamanaka

(10) Patent No.: US 8,878,756 B2
(45) Date of Patent: Nov. 4, 2014

(54) PIXEL CIRCUIT INCLUDING A FIRST SWITCHING ELEMENT SECTION SHOWING A SATURATION CHARACTERISTIC AND A SECOND SWITCHING ELEMENT SECTION SHOWING A LINEAR CHARACTERISTIC AND DISPLAY DEVICE INCLUDING THE PIXEL CIRCUIT

(75) Inventor: Shigetsugu Yamanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1027 days.

(21) Appl. No.: 12/734,871

(22) PCT Filed: Oct. 9, 2008

(86) PCT No.: PCT/JP2008/068381
§ 371 (c)(1),
(2), (4) Date: May 28, 2010

(87) PCT Pub. No.: WO2009/098802
PCT Pub. Date: Aug. 13, 2009

(65) Prior Publication Data
US 2010/0302285 A1    Dec. 2, 2010

(30) Foreign Application Priority Data
Feb. 8, 2008    (JP) .................. 2008-029698

(51) Int. Cl.
G09G 3/30    (2006.01)
G09G 3/32    (2006.01)
H01L 27/32    (2006.01)

(52) U.S. Cl.
CPC .......... *G09G 3/3233* (2013.01); *H01L 27/3262* (2013.01); *G09G 2300/0852* (2013.01); *G09G 2310/0262* (2013.01)
USPC .................. 345/82; 345/76; 345/77

(58) Field of Classification Search
USPC .................. 345/76–82; 315/169.1–169.3
See application file for complete search history.

(56) References Cited

U.S. PATENT DOCUMENTS 6,864,637 B2    3/2005 Park
8,284,130 B2 *  10/2012 Miyagawa et al. ............. 345/77

(Continued)

FOREIGN PATENT DOCUMENTS

CN    1574385    2/2005
JP    2003-280593    10/2003

(Continued)

OTHER PUBLICATIONS

European Search Report dated Feb. 7, 2011.

(Continued)

*Primary Examiner* — Ryan A Lubit
(74) *Attorney, Agent, or Firm* — Harness, Dickey & Pierce, P.L.C.

(57) ABSTRACT

A pixel circuit of at least one embodiment of the present invention includes: a display element whose light emitting luminance is controlled by a supplied current; at least one first switching element section whose output current characteristic shows a saturation characteristic in response to an input variable serving as a grayscale signal; and at least one second switching element section whose output current characteristic shows a linear characteristic in response to an input variable serving as a grayscale signal. A first current supply line which outputs a current determined by the first switching element section and a second current supply line which outputs a current determined by the second switching element section are combined, and then succeeded by a current supply line of the display element. This makes it possible to provide a pixel circuit and a display device which can generate higher peak luminance while sufficiently securing a voltage range which causes an appropriate normal grayscale display within a predetermined driver voltage output range.

20 Claims, 11 Drawing Sheets

(56) References Cited

U.S. PATENT DOCUMENTS

| | | |
|---|---|---|
| 2004/0252085 A1* | 12/2004 | Miyagawa ............ 345/76 |
| 2004/0252565 A1 | 12/2004 | Yamazaki |
| 2004/0256997 A1 | 12/2004 | Fukumoto et al. |
| 2005/0134189 A1 | 6/2005 | Osame |
| 2005/0264550 A1 | 12/2005 | Ohshima et al. |
| 2006/0071879 A1* | 4/2006 | Giraldo et al. ............ 345/82 |
| 2007/0085796 A1 | 4/2007 | Osame et al. |
| 2007/0132677 A1* | 6/2007 | Osame et al. ............ 345/82 |
| 2007/0241992 A1 | 10/2007 | Fukumoto et al. |
| 2008/0136750 A1 | 6/2008 | Benzarti |
| 2009/0189834 A1 | 7/2009 | Ohshima et al. |

FOREIGN PATENT DOCUMENTS

| | | |
|---|---|---|
| JP | 2004-341368 | 12/2004 |
| JP | 2004-361424 | 12/2004 |
| JP | 2005-202371 | 7/2005 |
| JP | 2006-509233 | 3/2006 |
| JP | 2006-106670 | 4/2006 |
| JP | 2007-316512 | 12/2007 |
| WO | WO 2004/088625 | 10/2004 |
| WO | WO 2006/087477 | 8/2006 |

OTHER PUBLICATIONS

English language international search report.

* cited by examiner 1101a, 1101b : DRIVING TFT
1102        : EL ELEMENT
1103        : WRITING SWITCH
1104        : PIXEL CAPACITOR
1105a, 1105b : VOLTAGE SHIFT CAPACITOR SWITCH
1106        : VOLTAGE SHIFT CAPACITOR
1121        : VOLTAGE SHIFT CAPACITOR CONTROL SIGNAL LINE
1122        : PIXEL CAPACITOR LINE
1023        : SIGNAL LINE
1024        : ROW SELECTION LINE
1125        : ANODE
1126        : CATHODE

PIXEL CIRCUIT INCLUDING A FIRST SWITCHING ELEMENT SECTION SHOWING A SATURATION CHARACTERISTIC AND A SECOND SWITCHING ELEMENT SECTION SHOWING A LINEAR CHARACTERISTIC AND DISPLAY DEVICE INCLUDING THE PIXEL CIRCUIT

TECHNICAL FIELD

The present invention relates to an active matrix display device such as an organic electroluminescence (hereinafter, referred to as "organic EL") display device. Specifically, the present invention relates to a configuration of a pixel circuit and a grayscale driving method of the pixel circuit.

BACKGROUND ART

According to a pixel cell of an active matrix organic EL display device, a series circuit is provided between (i) a power supply electrode 103 via which a power supply voltage Vp is supplied and (ii) a common electrode 104 via which a power supply voltage Vc is supplied (see FIG. 11). In the series circuit, a semiconductor switching element 106 is electrically connected with an organic EL thin film 108 serving as light emitting element. Moreover, a grayscale signal VD is supplied via a data signal line 101 to a gate terminal of the semiconductor switching element 106 so that the semiconductor switching element 106, which controls a light emitting current I, have predetermined electric conductivity. The grayscale signal VD is supplied to the gate terminal while a switching element 105 is turning on in response to a voltage VS supplied via a line 102. A capacitor element 107 which has a capacitance Cs in the pixel allows a gate voltage Vg to be held for a predetermined period of time so that light emission with a predetermined grayscale can be maintained.

According to a pixel configuration disclosed in Patent Literature 1, grayscale driving is carried out within a predetermined signal voltage range. According to a pixel circuit shown in FIG. 13, two current supplying lines (a line via which a current flows through a driving TFT 1101a and a line via which a current flows through a driving TFT 1101b) are selected, depending on whether a low grayscale level display or a high grayscale level display is carried out. Moreover, current supplying capacities of the respective two TFTs are set in accordance with grayscale display levels of which the respective two TFTs take their share. This allows each of the two TFTs to receive a high voltage Vgs even though a low current is supplied from each of the two TFTs. Accordingly a display can be carried out while it is being less affected by unevenness of threshold voltage.

Patent Literature 1

Japanese Patent Application Publication, Tokukai, No. 2004-341368 A (Publication Date: Dec. 2, 2004)

SUMMARY OF INVENTION

In a case where the organic EL display device has an active matrix pixel circuit, a current-voltage characteristic of a TFT element in a pixel affects a display quality.

In particular, it is necessary to set a current-voltage characteristic of a current control TFT, which determines a light emitting current of the organic EL element, so that a predetermined grayscale display can be carried out within a range of current and voltage of a control signal sent from a data signal driver, etc.

However, during a grayscale display within a predetermined voltage rage, in a case where luminance output of a pixel is to be increased so as to have a predetermined level or higher in accordance with content of an image for example, that is, in a case where a display, which causes the peak luminance, is to be carried out, a current-voltage characteristic of a single TFT element will limit a range of a signal voltage supplied from a driver or the like. This will limit a grayscale display range which causes higher peak luminance.

For example, in a case where a TFT which has been designed so as to operate in a saturation characteristic region is employed, a drain current change of the TFT is approximately proportional to the square of a gate voltage change.

A grayscale signal which is to be imposed on a gate voltage is supplied from a driver circuit. In order to set peak luminance to twice as high as maximum luminance of a normal grayscale display in a case where the full amplitude of the grayscale signal is, for example, approximately 5 Vpp, it is necessary to set a grayscale range so that a light emitting current can be generated for causing the peak luminance to be (i) twice as high as the maximum luminance during 5 Vpp voltage output and (ii) the same as the maximum luminance during approximately 3.5 Vpp voltage output. This is because of design limitation on voltage output. In a case where luminance which is three times as high as the maximum luminance is to be outputted during 5 Vpp voltage output, it is necessary to carry out a normal grayscale display within a range of approximately 2.9 Vpp voltage output.

In a case where still higher peak luminance is required, the voltage range for the normal grayscale display is limited to a narrower range.

However, in general, an occurrence frequency of grayscales which require the peak luminance increases, in a case where entire low grayscale display is carried out. Most of a display grayscale is within the range of the normal display grayscales. Accordingly, a voltage output range of the driver is concentrated on voltage outputs on low grayscale side. Therefore, the voltage range is not effectively utilized.

That is, in a case where (i) a driver element has a specification of voltage output 5 Vpp but (ii) a voltage output is actually used within 3 Vpp for a normal display, it is possible to obtain the advantage in view of power consumption and module cost if the driver is caused to be compatible with a specification of voltage output 3.5 Vpp. However, as described above, a voltage range needs to be secured widely enough for obtaining the peak luminance.

As described above, there is a limitation on voltage output of the signal driver. As such, in a case where higher peak luminance is intended to be generated, a voltage range which causes a normal grayscale display is narrowed. This leads to a problem that the driver voltage output range cannot be utilized efficiently.

The present invention is accomplished in view of the problem, and its object is to provide a pixel circuit and a display device which are capable of generating higher peak luminance while sufficiently securing a voltage range which causes an appropriate normal grayscale display within a predetermined driver voltage output range.

In order to attain the object, a pixel circuit of the present invention includes: a display element whose luminance is controlled by a supplied current; at least one first switching element section whose output current characteristic shows a saturation characteristic in response to an input variable serving as a grayscale signal; and at least one second switching element section whose output current characteristic shows a linear characteristic in response to an input variable serving as a grayscale signal, (i) a first current supply line which outputs a current determined by the at least one first switching element section and (ii) a second current supply line which outputs a current determined by the at least one second switching element section being combined, and then being succeeded by a current supply line of the display element.

According to the invention, the first switching element section outputs a current in the saturation characteristic region and the second switching element section outputs a current in the linear region. The currents are combined and then supplied to the display element. Accordingly, on a low grayscale region side, the current outputted from the first switching element section becomes predominant among currents supplied to the display elements. On a high grayscale region side, in accordance with change in luminance, a current which is to be supplied to the display element can be drastically changed due to the current outputted from the second switching element section.

As described above, a large light emitting current can be generated by comparatively small signal voltage amplitude with the use of the first switching element section indicative of a saturation characteristic and a second switching element section indicative of a linear characteristic with together. According to the configuration, signal voltage amplitude for displaying a normal grayscale can be wide enough within a signal voltage amplitude range restricted by a driver, etc.

The configuration makes it possible to provide a pixel circuit which can generate higher peak luminance while sufficiently securing a voltage range which causes an appropriate normal grayscale display within a predetermined driver voltage output range.

In order to attain the object, in the pixel circuit of the present invention, each of the at least one first switching element section and the at least one second switching element section is (i) made up of a single semiconductor element having two or more terminals or is (ii) made up of a circuit in which a plurality of semiconductor elements are connected in parallel with each other.

According to the invention, each of the first switching element section and the second switching element section can be easily made up of a conventionally known semiconductor element which has two or more terminals.

In order to attain the object, in the pixel circuit of the present invention, each of the at least one first switching element section and the at least one second switching element section is (i) made up of a single thin film transistor having three or more terminals, or is (ii) made up of a circuit in which a plurality of thin film transistors are connected in parallel with each other.

According to the invention, each of the first switching element section and the second switching element section can be easily made up of a conventionally known thin film transistor which has three or more terminals.

In order to attain the object, in the pixel circuit of the present invention, a relation $W1/L1 \leq W2/L2$ is satisfied, where W1 and L1 respectively represent a total of gate channel width(s) and each gate channel length of the thin film transistor(s) constituting the at least one first switching element section, and W2 and L2 respectively represent a total of gate channel width(s) and each gate channel length of the thin film transistor(s) constituting the at least one second switching element section.

According to the invention, the first switching element section and the second switching element section can easily have a saturation characteristic and a linear characteristic, respectively, in accordance with the setting of the size of the thin film transistor.

In order to attain the object, in the pixel circuit of the present invention, the thin film transistor(s) constituting the at least one first switching element section and the thin film transistor(s) constituting the at least one second switching element section are P-type transistors; the thin film transistor(s), constituting the at least one first switching element section and serving as a first thin film transistor(s), has a saturation characteristic with a threshold voltage Vth1 and generates an output current from a supply voltage V1 of a first power supply line; the thin film transistor(s), constituting the at least one second switching element section and serving as a second thin film transistor(s), has a linear characteristic with a threshold voltage Vth2 and generates an output current from a supply voltage V2 of a second power supply line; a current output terminal(s) of the first thin film transistor(s) and a current output terminal(s) of the second thin film transistor(s) are connected to one terminal electrode of the display element and the other terminal electrode of the display element is connected to a common electrode; and a relation $V1+Vth1 \geq V2+Vth2$ is satisfied.

According to the invention, in a normal grayscale display, output current contribution of the first thin film transistor becomes predominant, whereas in a high grayscale display and a peak luminance display, an output current of the second thin film transistor contributes significantly.

In order to attain the object, in the pixel circuit of the present invention, a relation $V1 \geq V2$ is satisfied.

According to the invention, a rate of change of a grayscale luminance output with respect to a grayscale signal can be increased in a high grayscale display. Accordingly, a current which is several times as large as that in a normal grayscale display can be obtained with a small increase of change of a signal voltage.

In order to attain the object, in the pixel circuit of the present invention: the thin film transistor(s) constituting the at least one first switching element section and the thin film transistor(s) constituting the at least one second switching element section are N-type transistors; the thin film transistor(s), constituting the at least one first switching element section and serving as a first thin film transistor(s), has a saturation characteristic in which a threshold voltage is Vth1 and generates an output current from a supply voltage V1 of a first power supply line; the thin film transistor(s), constituting the at least one second switching element section and serving as a second thin film transistor(s), which has a linear characteristic in which a threshold voltage is Vth2 and generates an output current from a supply voltage V2 of a second power supply line; a current output terminal(s) of the first thin film transistor(s) and a current output terminal(s) of the second thin film transistor(s) are connected to one terminal electrode of the display element and the other terminal electrode of the display element is connected to a common electrode; and a relation $V1+Vth1 \leq V2+Vth2$ is satisfied.

According to the invention, in a normal grayscale display, contribution of an output current of the first thin film transistor becomes predominant, whereas in a high grayscale display and a peak luminance display, an output current of the second thin film transistor contributes significantly.

In order to attain the object, in the pixel circuit of the present invention, a relation $V1 \leq V2$ is satisfied.

According to the invention, a rate of change of a grayscale luminance output with respect to a grayscale signal can be increased in a high grayscale display. Accordingly, a current which is several times as large as that in a normal grayscale display can be obtained with a small increase of change of a signal voltage.

In order to attain the object, in the pixel circuit of the present invention, an identical voltage is supplied to each gate terminal of the thin film transistors constituting the at least one first and second switching element sections.

According to the invention, the first switching element section and the second switching element section can share a line through which a gate voltage is supplied. This leads to simplification of the circuit structure.

In order to attain the object, the pixel circuit of the present invention further includes at least one thin film transistor which is provided so as to electrically connect or disconnect a current to be supplied to the display element, the at least one thin film transistor being provided on a current supply line made up of (i) a current supply line routed from the first power supply line to the common electrode via the at least one first switching element section and the display element and (ii) a current supply line routed from the second power supply line to the common electrode via the at least one second switching element section and the display element.

According to the invention, display timing can be arbitrarily controlled within a frame by further providing the at least one thin film transistor so as to electrically connect or disconnect a current to be supplied to the display element.

In order to attain the object, in the pixel circuit of the present invention, a non-lighting process during a lighting display process in which the display element is used includes a process in which an initial voltage is applied to at least one of (i) the gate terminal(s) of the thin film transistor(s) constituting the at least one first switching element section and (ii) the gate terminal(s) of the thin film transistor(s) constituting the at least one second switching element section.

In general, the first switching element section and the second switching element do not operate uniformly, and event adjacent elements are different in their current-voltage characteristics. According to the invention, an initial voltage of the gate voltage is set whereby the gate voltage is shifted with reference to the initial voltage in response to a data signal. This makes it possible to reduce unevenness of light emitting currents occurred due to a threshold value.

In order to attain the object, in the pixel circuit of the present invention, in a grayscale signal voltage amplitude range, having a grayscale range normalized so that: a normal grayscale range lies between 0 and 1; and a peak grayscale range lies more than 1, which is normalized so that grayscale signal voltage amplitude for displaying the normal grayscale range lies between 0 and 1 and grayscale signal voltage amplitude for displaying the peak grayscale range lies more than 1, (i) a light emission contribution ratio of the at least one second switching element section is 20% or more when the grayscale signal voltage amplitude is $2/3$ or more and (ii) the light emission contribution ratio is increased in response to a change in grayscale signal voltage amplitude corresponding to an increase in display grayscale level.

According to the invention, when the value of the grayscale signal voltage amplitude is $2/3$ or more within the grayscale signal voltage amplitude range, an increase in brightness in the high grayscale region can be perceived because the second switching element section has 20% or more of lighting contribution ratio. This makes it possible to appropriately display a high grayscale level within the normal grayscale range while securing the peak luminance.

In order to attain the object, in the pixel circuit of the present invention, a light emission contribution ratio of the at least one first switching element section is 45% or more but 55% or less when the normalized range of grayscale signal voltage amplitude is 1.

According to the invention, the lightness index curve can be made to have approximately a linear shape in the high grayscale region.

In order to attain the object, in the pixel circuit of the present invention, when the grayscale signal voltage amplitude is $1/3$ or more but less than $2/3$ in the grayscale signal voltage amplitude range, (i) a light emission contribution ratio of the at least one second switching element section is 0% or more but less than 20% and (ii) the light emission contribution ratio is increased in response to a change in grayscale signal voltage amplitude corresponding to an increase in display grayscale level.

According to the invention, change of the lightness index becomes significantly smooth with respect to luminance change, whereby unnaturalness in a display can be reduced.

In order to attain the object, in the pixel circuit of the present invention, when the grayscale signal voltage amplitude is less than $1/3$ in the grayscale signal voltage amplitude range, (i) a light emission contribution ratio of the at least one second switching element section is 0% or more but less than 20% and (ii) the light emission contribution ratio is increased in response to a change in grayscale signal voltage amplitude corresponding to an increase in display grayscale level.

According to the invention, change of the lightness index becomes smooth with respect to luminance change, whereby unnaturalness in a display can be reduced.

In order to attain the object, in the pixel circuit of the present invention, in a grayscale signal voltage amplitude range, having a grayscale range normalized so that: a normal grayscale range lies between 0 and 1; and a peak grayscale range lies more than 1, which is normalized so that grayscale signal voltage amplitude for displaying the normal grayscale range lies between 0 and 1 and grayscale signal voltage amplitude for displaying the peak grayscale range lies more than 1, an error of a gradient of a lightness index curve falls within 5% with respect to an ideal linear relation, in a characteristic of lightness index to grayscale signal voltage amplitude, when the grayscale signal voltage amplitude is $2/3$ or more.

According to the invention, an increase in brightness in the high grayscale region can be perceived more easily.

In order to attain the object, in the pixel circuit of the present invention, the display element is an organic light emitting diode.

According to the invention, it is possible to provide an organic EL display device having high display quality by utilizing a dynamic range of an organic light emitting diode within a predetermined driver output range.

In order to attain the object, a display device of the present invention includes: a plurality of the pixel circuits; a pixel selection signal circuit section which supplies a selection signal to the pixel circuit so as to permit the pixel circuit to receive the grayscale signal; a grayscale signal supply circuit section which supplies the grayscale signal to the pixel circuit; a first power supply line whose supply is used for generating an output current by the at least one first switching element section; a second power supply line whose supply is used for generating an output current by the at least one second switching element section; a scan signal line through which the selection signal supplied from the pixel selection signal circuit section is transmitted to the pixel circuit; and a data signal line through which the grayscale signal supplied from the grayscale signal supply circuit section is transmitted to the pixel circuit.

According to the invention, it is possible to provide a display device which can generate higher peak luminance while sufficiently securing a voltage range which causes an appropriate normal grayscale display within a predetermined driver voltage output range.

For a fuller understanding of the nature and advantages of the invention, reference should be made to the ensuing detailed description taken in conjunction with the accompanying drawings.

BRIEF DESCRIPTION OF DRAWINGS

FIG. 1 is a circuit block diagram illustrating a basic configuration of a pixel circuit in accordance with an embodiment of the present invention.

FIG. 2 is a circuit diagram illustrating Example 1 of the pixel circuit shown in FIG. 1.

FIG. 3 is a characteristic diagram illustrating a relation between (i) a gate voltage and (ii) output currents from a first thin film transistor and a second thin film transistor.

FIG. 4 is a circuit diagram illustrating Example 2 of the pixel circuit shown in FIG. 1.

FIG. 5 is a characteristic diagram illustrating a relation between a light emitting element current and a grayscale signal voltage in the pixel circuit shown in FIG. 4.

FIG. 6 is a characteristic diagram illustrating a relation between a magnification ratio of normal grayscale current and a grayscale signal voltage in the pixel circuit shown in FIG. 4.

FIG. 7 is a characteristic diagram illustrating a relation between (i) normalized luminance and a normalized lightness index and (ii) normalized grayscale signal voltage amplitude in the pixel circuit shown in FIG. 4.

FIG. 8 is a characteristic diagram illustrating a relation between (i) normalized luminance and a normalized lightness index and (ii) normalized grayscale signal voltage amplitude in the pixel circuit shown in FIG. 1.

FIG. 9 is a characteristic diagram illustrating a relation between a normalized lightness index and normalized grayscale signal voltage amplitude in the pixel circuit shown in FIG. 1.

FIG. 10 is a characteristic diagram illustrating a relation between a contributing rate of luminance increase and normalized grayscale signal voltage amplitude in the pixel circuit shown in FIG. 1.

FIG. 11 is a circuit diagram illustrating a structure of a pixel circuit according to a comparative example for the present embodiment.

FIG. 12 is a characteristic diagram illustrating a relation between an output current from a thin film transistor and a gate voltage in the pixel circuit shown in FIG. 11.

FIG. 13 is a circuit diagram illustrating a structure of a pixel circuit according to a conventional technique.

FIG. 14 is a block diagram illustrating a structure of a display device including the pixel circuit shown in FIG. 4, according to an embodiment of the present invention.

REFERENCE SIGNS LIST

1, 2, 3: Pixel circuit
304: First semiconductor element (first switching element section, first thin film transistor)
305: Second semiconductor element (second switching element section, second thin film transistor)
306, 400, 600: Light emitting element (display element)
401a: TFT (First switching element section, first thin film transistor)
401b: TFT (Second switching element section, second thin film transistor)
601a: TFT (First switching element section, first thin film transistor)
601b: TFT (Second switching element section, second thin film transistor)
301: Power supply electrode (first power supply line)
302: Power supply electrode (second power supply line)
402a, 602a: Voltage line for current supply (first power supply line)
402b, 602b: Voltage line for current supply (second power supply line)
1402: Grayscale signal line (data signal line)
1403: Line selection line (scan signal line)
1404a: Power supply line (First power supply line)
1404b: Power supply line (Second power supply line)
1406: Source driver circuit (grayscale signal supplying circuit section)
1407: Gate driver circuit (pixel selection signal circuit section)

DESCRIPTION OF EMBODIMENTS

The following describes one embodiment of the present invention with reference to FIGS. 1 through 12, and FIG. 14.

Figure 1:
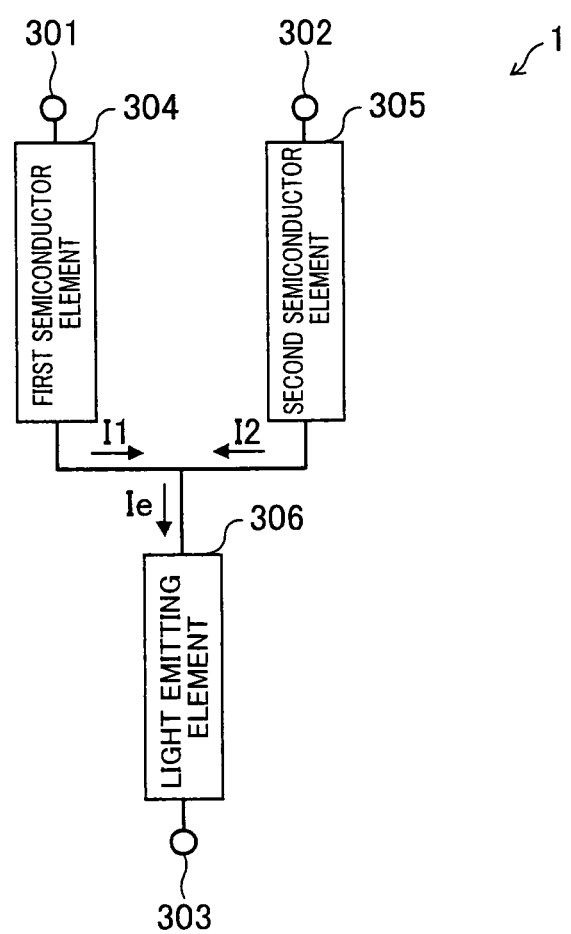
FIG. 1

FIG. 1 illustrates a basic configuration of a pixel circuit 1 in accordance with the present embodiment.

The pixel circuit 1 shows a circuit configuration which controls a light emitting current relating to a grayscale display. The pixel circuit 1 includes a first semiconductor element (a first switching element section, a first thin film transistor) 304, a second semiconductor element (a second switching element section, a second thin film transistor) 305, and a light emitting element (a display element) 306. According to the present embodiment, two semiconductor elements are provided. However, the number of the semiconductor elements is not limited to two. Instead, a plurality of semiconductor elements can be generally provided.

Each of the first semiconductor element 304 and the second semiconductor element 305 is a switching element for light emitting current control, which switching element controls a light emitting current Ie to be supplied to the light emitting element 306. The light emitting element 306 is an element, such as an organic light emitting diode, whose luminance is controlled by a supplied current. A light emitting current I1 which is controlled by the first semiconductor element 304 and a light emitting current I2 controlled by the second semiconductor element 305 flow through respective current supply lines. The current supply lines are combined on their current output terminal sides and thus combined lines are succeeded by one end of the light emitting element 306 serving as a single light emitting element.

A power supply electrode (a first power supply line) 301 and a power supply electrode (a second power supply line) 302 are connected to the first and second semiconductor elements 304 and 305, respectively, on their sides opposite to the combined lines. Voltages of the power supply electrodes 301 and 302 can be identical to each other. However, the voltages can be generally different from each other. Note that the other end of the light emitting element 306 is connected to a common electrode 303. It follows that (i) each of the first and second semiconductor elements 304 and 305 and (ii) the light emitting element 306 are connected in series between the common electrode 303 and the power supply electrode 301 or 302. In a case where a plurality of semiconductor elements are provided in general, light emitting currents controlled by the respective plurality of semiconductor elements flow through current supply lines. The current supply lines are combined and succeeded by the light emitting element 306. It follows that (i) each of the plurality of semiconductor elements and (ii) the light emitting element 306 are connected in series between a corresponding one of a plurality of power supply electrodes and the common electrode 303.

At least one of the plurality of current supply lines which are connected to the light emitting element 306 is made up of a semiconductor element having a current-voltage characteristic mainly indicative of a saturation characteristic (such a saturation characteristic is also called a steady-state current characteristic, i.e., a constant current characteristic, in a case where a current can be regarded as constant like a current of a saturation region especially in an MOS transistor). According to the present embodiment, the at least one of the plurality of current supply lines is made up of the first semiconductor element 304. Moreover, at least other one of the plurality of current supply lines is made up of a semiconductor element having a current-voltage characteristic mainly indicative of a linear characteristic. According to the present embodiment, the at least other one of the plurality of current supply lines is made up of the second semiconductor element 305.

Each of the plurality of semiconductor elements has at least two terminals and has a switch characteristic in which a current ratio between a conducting state and a nonconducting state is 100 or more at the maximum and minimum voltages of the predetermined voltage range is applied.

According to the present embodiment, the first semiconductor element 304 shows a saturation characteristic, when a predetermined voltage or more is supplied across two terminals of the first semiconductor element 304.

For example, in a case where the first semiconductor element 304 is a P-type TFT 1 which has three terminals (i.e., three terminals of a source, a drain, and a gate), (i) a voltage difference Vds1 which is sufficiently larger than a threshold voltage Vth1 of the TFT 1 is applied between the drain and the source and (ii) a voltage difference Vgs1 which is smaller than the voltage difference Vds1 is applied between the gate and the source (see an inequality (1)). According to the pixel circuit 1, a gate voltage of the first semiconductor element 304 corresponds to an input variable serving as a grayscale signal, and the first semiconductor element 304 outputs a current in response to the gate voltage.

$$Vds1 = Vs1 - Vd1 \gg -Vth1$$

$$Vgs1 = Vs1 - Vg1 \leq Vds1 \tag{1}$$

Note that the threshold voltage Vth1 (i) indicates a threshold voltage at which the TFT 1 is switched from a nonconducting state to a conducting state and (ii) is defined as a difference when the gate voltage Vg1 is subtracted from the source voltage Vs1 as a reference voltage, having a negative value. Note also that, a general threshold voltage Vth can be either (i) a gate-source voltage Vgs0 which corresponds to a predetermined source-drain current Ids0 which can be substantially regarded as a border at which the TFT 1 is turned on or off or (ii) a voltage derived from a general current-voltage approximate equation.

According to the present embodiment, the TFT 1 is a P-type TFT. Accordingly, voltages of the respective terminals meet the following inequality (2), i.e., the drain voltage Vd1 becomes smaller than the source voltage Vs1 as the reference voltage. Moreover, the gate voltage Vg2 falls in a voltage range indicated by the following inequality (3) when the TFT 1 is in a nonconducting state, whereas the gate voltage Vg2 falls in a voltage range indicated by the following inequality (4) when the TFT 1 is in a conducting state.

$$Vs1 > Vd1 \tag{2}$$

$$Vg1 > Vs1 + Vth1 \tag{3}$$

$$Vg1 \leq Vs1 + Vth1 \tag{4}$$

According to the configuration, while a voltage between the gate and the source is being constant, a constant current characteristic is shown. This is because a change in the drain-source current will be very small, even if a drain-source voltage is slightly fluctuated. For example, if the drain-source voltage is changed by about 1 V, then the drain-source current will have a fluctuation of approximately several percent or less, provided that the gate-source voltage is constant.

Moreover, a drain-source current changes in proportion to approximately the square of a gate-source voltage while the TFT 1 is turning on.

In general, a range of a condition indicative of such a voltage-current characteristic is called a saturation characteristic region.

On the other hand, a current, which flows two terminals of the second semiconductor element 305, is approximately in proportion to a voltage between the two terminals.

For example, in a case where the second semiconductor element 305 is a P-type TFT 2 which has three terminals (i.e., three terminals for a source, a drain, and a gate), (a) a voltage difference Vds2 which is either approximately the same as or smaller than a threshold voltage Vth2 of the TFT 2 is applied between the drain and the source, and (ii) a voltage difference Vgs2 which is sufficiently larger than the voltage difference Vds2 is applied between the gate and the source (see an inequality (5)). Note that the threshold voltage Vth2 (i) indicates a threshold voltage at which the TFT 2 is switched from a nonconducting state to a conducting state and (ii) is defined as a difference when the gate voltage Vg2 is subtracted from the source voltage Vs2 as a reference voltage, having a negative value. According to the pixel circuit 1, a gate voltage of the second semiconductor element 305 corresponds to an input variable serving as a grayscale signal, and the second semiconductor element 305 outputs a current in response to the gate voltage.

$$Vds2 = Vs2 - Vd2 < \sim -Vth2$$

$$Vgs2 = Vs2 - Vg \gg Vds2 \tag{5}$$

According to the present embodiment, the TFT 2 is a P-type TFT. Accordingly, voltages of the respective terminals meet the following inequality (6), i.e., the drain voltage Vd2 becomes smaller than the source voltage Vs2 as the reference voltage. Moreover, the gate voltage Vg2 falls in a voltage range indicated by the following inequality (7) when the TFT 2 is in a nonconducting state, whereas the gate voltage Vg2 falls in a voltage range indicated by the following inequality (8) when the TFT 2 is in a conducting state.

$$Vs2 > Vd2 \quad (6)$$

$$Vg2 > Vs2 + Vth2 \quad (7)$$

$$Vg2 \leq Vs2 + Vth2 \quad (8)$$

According to the TFT 2, a conducting current between the source and the drain is approximately in proportion to the voltage difference Vds2 between the source and the drain as long as the voltage condition is satisfied. In general, a range of a condition indicative of such a voltage-current characteristic is called a linear characteristic region.

As described above, the power supply electrodes 301 and 302 supply the light emitting currents I1 and I2 of the respective TFT 1 and the TFT 2 flow together, and then are supplied, as a light emitting current Ie, to the common electrode via the light emitting element. A grayscale display is carried out with luminance approximately in proportion to the current supplied to the light emitting element.

According to the circuit configuration, a current contribution by the TFT 1 is predominant in the light emission of the light emitting element 306 during a comparatively low grayscale display. Further, a current contribution by the TFT 2 is added in the light emission of the light emitting element 306 during a high grayscale display. During a higher grayscale peak luminance display, the TFT 2 can provide a current contribution in the light emission of the light emitting element 306 several times as large as only the TFT 1 can contribute to.

According to the configuration, it is possible to (i) obtain higher luminance with an identical gate signal voltage amplitude and (ii) carry out a normal grayscale display in a sufficiently wide voltage range, as compared with a case where a grayscale display is carried out by a current contribution by only the TFT 1, i.e., as compared to a case where the light emitting current Ie which is approximately proportional to the square of a gate voltage amplitude is applied to the light emitting element 306.

Note that each of the TFT 1 and the TFT 2 which controls the light emitting current Ie can be a single semiconductor element or can be substituted with a parallel circuit of a plurality of semiconductor elements.

The circuit configuration makes it possible to arbitrarily set a current output function for a grayscale signal. Accordingly, grayscale display quality can be improved.

Moreover, it is possible to provide a single third TFT 3 or a plurality of third TFTs 3, so as to control electrical connection or disconnection of the light emitting current Ie, on a current supply line made up of (i) a current supply line routed from the power supply electrode 301 to the common electrode 303 via the TFT1 and the light emitting element 306, and (ii) a current supply line routed from the power supply electrode 302 to the common electrode 303 via the TFT 2.

The circuit configuration makes it possible to carry out a display at arbitrary timing during a frame period. Moreover, the circuit configuration allows an easy control in which a current characteristic of a TFT in a pixel and a current characteristic of a TFT in another pixel to become almost uniform. Accordingly, grayscale display quality can be improved.

Moreover, according to the configuration, it is preferable that a relation, between the source voltage Vs1 of the TFT 1 that shows a constant current output characteristic and the source voltage Vs2 of the TFT 2 that shows a linear current output characteristic, satisfies the following inequality (9). Note that each of the TFTs 1 and 2 is of an identical type, i.e., a P-type (an identical type) TFT or an N-type TFT. In a case of the P-type, C=−1, whereas in a case of the N-type, C=1.

$$C \cdot Vs1 \leq C \cdot Vs2 \quad (9)$$

This makes it possible to increase a rate of change of a grayscale luminance output with respect to a grayscale signal during a high grayscale display. Accordingly, it is possible to obtain, with a small increase in signal voltage change, a light emitting current Ie which is several times as large as that during a normal grayscale display.

Note that the term "normal grayscale display" used in this specification intends to a display which is carried out within a grayscale level range which corresponds to a signal voltage amplitude range in which 256 luminance levels corresponding to 0 through 255 grayscale levels are outputted in a case where a display grayscale is an 8-bit grayscale for example.

For example, in a case where (i) original grayscale signal voltage amplitude range is up to 3 Vpp and (ii) a signal voltage amplitude range is up to 2.5 Vpp for expressing an identical grayscale level range by the circuit configuration of the present embodiment, the signal voltage amplitude range up to 2.5 Vpp is a signal voltage range within which the normal grayscale display can be carried out.

Moreover, according to the configuration, it is preferable that a relation between (i) the source voltage Vs1 and the threshold voltage Vth1 of the TFT 1 and (ii) the source voltage Vs2 and the threshold voltage Vth2 of the TFT 2 satisfies the following inequality (10). Note that, in this case also, each of the TFTs 1 and 2 is of an identical type, i.e., a P-type (an identical type) TFT or an N-type TFT. In a case of the P-type, C=−1, whereas in a case of the N-type, C=1.

$$C \cdot (Vs1 + Vth1) \leq C \cdot (Vs2 + Vth2) \quad (10)$$

Because of this, it becomes possible that (i) the TFT 1 predominantly contributes to the light emission of the light emitting element 306 during a normal grayscale display and (ii) the TFT 2 more largely contributes to the light emission of the light emitting element 306 during a higher grayscale display or a peak luminance display.

According to the circuit configuration, in a case where the TFT 1 and the TFT 2 have an identical type, it is preferable that the gate voltages Vg1 and Vg2 of the respective TFTs have an identical electric potential. This allows a line(s) to be shared in the circuit configuration, thereby simplifying the circuit configuration.

The present embodiment discusses a case where the semiconductor element is a TFT element having three terminals. The present embodiment, however, is not limited to this. The semiconductor element can be an element having two terminals or a switching element having four or more terminals.

According to the circuit configuration, it is preferable that a non-light-emission process (non-lighting process) during a series of light-emission display process includes a process in which at least one of the TFT 1 which has a constant current characteristic and the TFT 2 which has a linear characteristic is set to receive a predetermined gate voltage. This is because the light emitting current control elements are generally subjected to variations in processes, and therefore even adjacent light emitting current control elements have variations in current-voltage characteristics. Accordingly, even though an identical gate voltage is supplied to all of the pixels, it is highly possible that there occur variations in light emitting currents because the light emitting current control elements have threshold characteristics and mobility characteristics which are slightly different from each other.

Therefore, it is preferable that each of the TFT 1 and the TFT 2 includes, for example, a circuit which is capable of setting an initial voltage of a gate voltage so that the initial voltage is near the threshold voltage. As such, it is possible to control variations in light emitting currents caused by the threshold voltages, when (i) such a circuit allows the initial voltages of the respective gate voltages to be uniformed close to the threshold voltages of the respective TFTs and then (ii) the gate voltages are shifted, on the basis of the initial voltages, in response to a data signal.

According to the circuit configuration, in a grayscale range of ⅔ (0.667) or more of a grayscale range which is normalized by the normal grayscale range of 0 to 1 and a peak grayscale range of more than 1, it is preferable that a current contribution indicative of the light emission contribution of the TFT 2 which carries out linear operation is 20% or more.

Note in a case where the normalized normal grayscale range (0 to 1) is expressed by an 8-bit grayscale that, (i) a region in which a normalized grayscale level is 0 or more but less than ⅓ (≈0.333) is defined as a low grayscale region corresponding to grayscales 0 through 84; a region in which a normalized grayscale level is ⅓ (≈0.333) or more but less than ⅔ (≈0.667) is defined as an intermediate grayscale region corresponding to grayscales 85 through 169; a region in which a normalized grayscale level is ⅔ (≈0.667) or more but 1 or less is defined as a high grayscale region corresponding to grayscales 170 through 255; and a region in which a normalized grayscale level is more than 1 is defined as a peak grayscale region corresponding to grayscales 256 or more.

As to the grayscale representation, even in a case where the number of bits for expressing the normal grayscale levels is other than 8, a grayscale range is defined based on a concept similar to the concept described above.

When a grayscale level is in the high grayscale region within the range defined above, 20% or more of the light emitting current Ie is contributed, as a lighting contribution, by the TFT 2 which linearly operates. The reason thereof is described below.

An L*v*u* color system (JIS Z8729) in the CIE1976CUS chromaticity diagram is one of color spaces (uniform color spaces) which (i) have perceptually almost uniform color difference and (ii) are recommended by the CIE (International Commission on Illumination) in 1976. "L*" represents a lightness index and "u*" and "v*" represent chromaticity. The color coordinate system is widely employed in a device such as a monitor which itself emits light.

In view of visibility, the most important parameter for carrying out a display is the lightness index L* which is defined by a ratio of light emitting luminance Y with respect to background luminance Yn as follows.

$$L^* = 116(Y/Yn)^{1/3} \text{ where } Y/Yn > 0.008856 \quad (11)$$

That is, the lightness index L* is perceived in proportion to $(Y/Yn)^{1/3}$. As is clear from the equation (11), the lightness index L* in a bright part changes more gradually as the luminance Y becomes larger. Accordingly, during a high grayscale level display, a slight change in luminance would not allow a change in brightness to be perceived so much.

A natural image display can be achieved by controlling light emitting luminance so that a lightness index is increased substantially in proportion to grayscale signal voltage amplitude.

Figure 8:
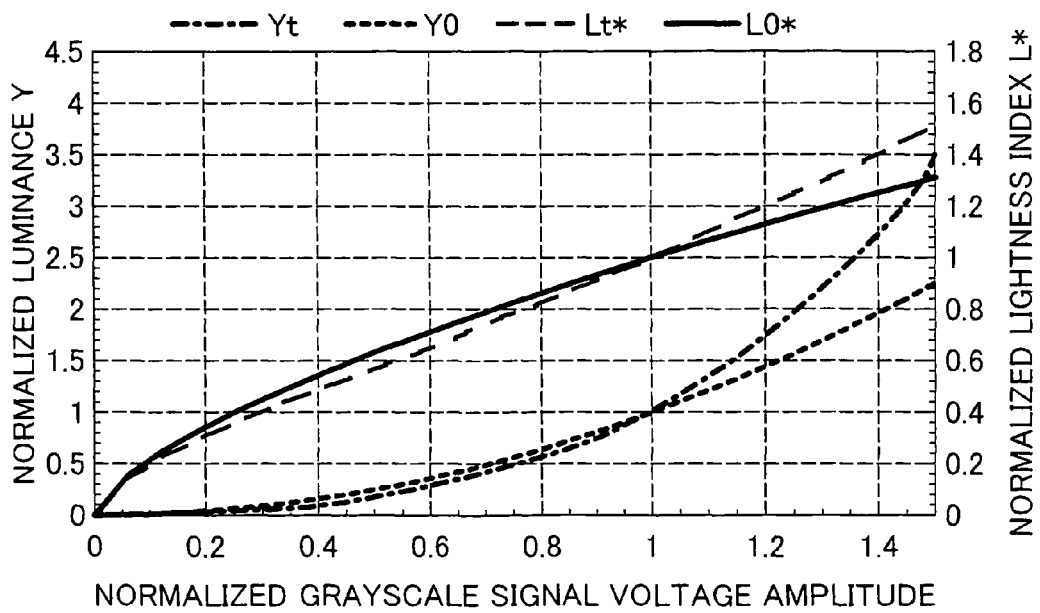
FIG. 8

FIG. 8 illustrates (i) a luminance curve Y0 which is obtained in a case where luminance is quadratically changed in response to a supplied grayscale signal, and a corresponding lightness index curve L0* and (ii) a luminance characteristic curve Yt having a feature which the present embodiment shows and a corresponding lightness index curve Lt*.

Note, here, that a grayscale signal voltage is normalized within a predetermined output amplitude range.

A range, in which a normalized grayscale signal voltage causes a normal grayscale display, lies between 0 and 1, and a grayscale signal voltage of more than 1 is in a range in which a peak grayscale is displayed. For example, in a case where the full amplitude of the driver output is 5 Vpp, the normal grayscale range is set within 3 Vpp, and a peak grayscale range lies between 3 Vpp (exclusive) and 5 Vpp (inclusive).

According to FIG. 8, a typical current-voltage characteristic is approximated, in a saturation characteristic region of a typical TFT, by a quadratic function. As such, the luminance Y0 of the light emitting element 306 quadratically changes in response to a supplied signal voltage. Note that the lightness index L0* is an increasing function of which the gradient decreases as the grayscale level becomes higher.

As is clear from FIG. 8, the lightness index shows (i) a relatively steep change when the normalized grayscale signal voltage amplitude is approximately 0.5 or smaller and (ii) a gradually gentle change when the normalized grayscale signal voltage amplitude is greater than 0.5. Accordingly, in the high grayscale region, no change in brightness can be perceived even though the luminance is increased in some degree.

Therefore, it is preferable to show a linear lightness index curve in response to the grayscale signal voltage amplitude.

In a case where the lightness index L* is kept to substantially linearly change in response to the normalized grayscale signal voltage amplitude irrespective of grayscale level, that is, in a case where an error of a gradient of the lightness index curve is kept to fall within 5% with respect to the ideal linear relation, it is preferable that, when the normalized grayscale signal voltage amplitude is 0.667, at least 25% increase in luminance is required so that the increase in luminance is larger as compared to an increase in the grayscale signal voltage amplitude. Further, a change amount of increase is preferable to be set so that an approximately 100% increase in the luminance is obtained when the normalized grayscale signal voltage amplitude is 1.

This allows a contribution rate, due to the increase in luminance of the TFT 2 with respect to whole light emitting luminance, to be 20% when the normalized grayscale signal voltage amplitude is 0.667, and approximately 50% when the normalized grayscale signal voltage amplitude is 1. The contribution rates of a light emitting current caused by the TFT 2 become similar ones.

This will be described with reference to FIGS. 9 and 10.

Figure 9:
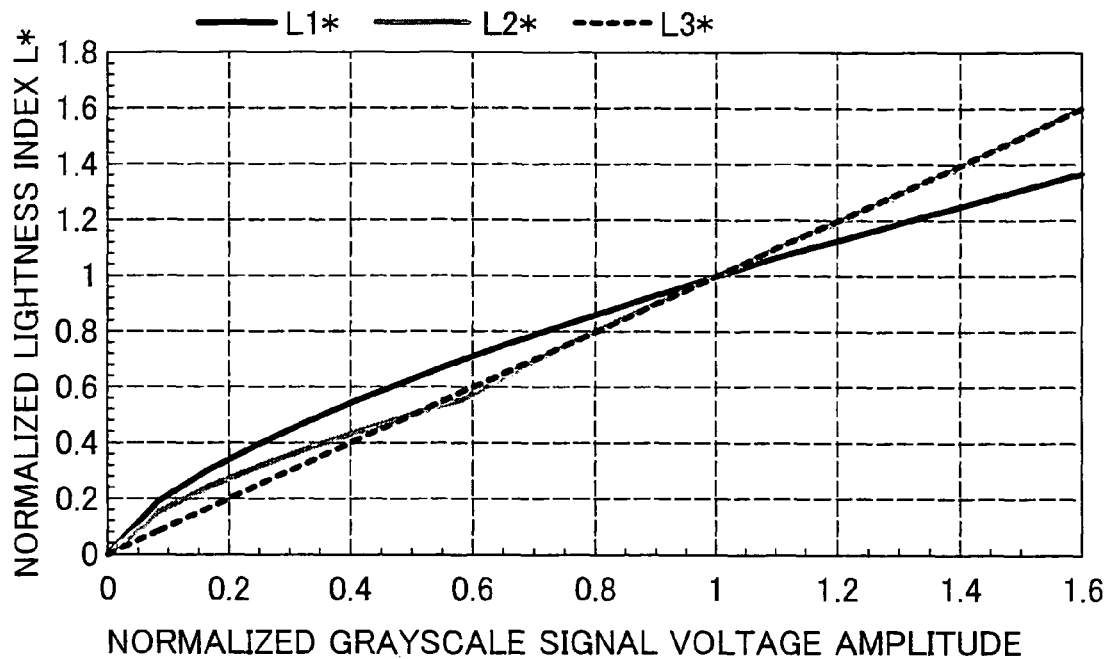
FIG. 9

FIG. 9 shows how normalized lightness indexes change in response to normalized grayscale signal voltage amplitude. L1* indicates a normalized lightness index obtained in a case where the luminance changes in proportion to the square of grayscale signal voltage amplitude. L2* indicates an example where a lightness index is set based on the above design so as to substantially linearly change when normalized grayscale signal voltage amplitude is beyond a specific one. L3* represents a reference value obtained in a case where a lightness index completely linearly changes in response to the normalized grayscale signal voltage amplitude. Moreover, FIG. 10 illustrates how a contribution rate of a linear TFT 2 due to an increase in luminance changes in response to the normalized grayscale signal voltage amplitude.

Figure 10:
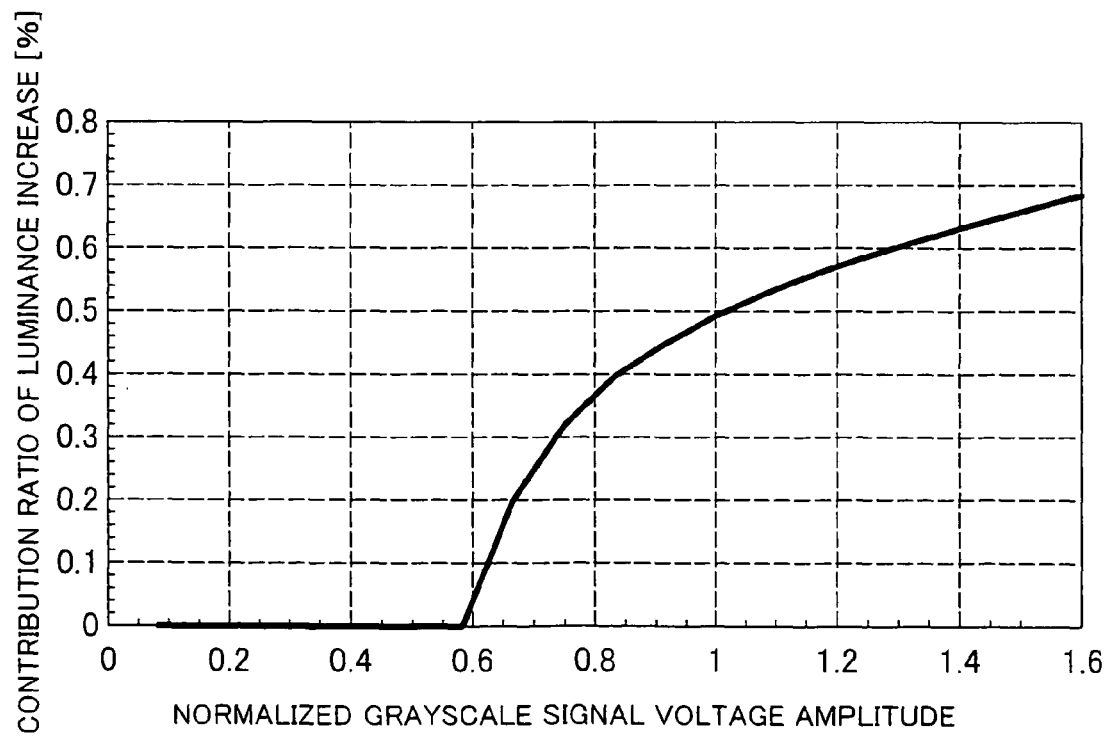
FIG. 10

The lightness index L2* in FIG. 9 represents a characteristic in which (i) the contribution rate of the increase in luminance (i.e., a lighting contribution) by the TFT 2 is 20% when the normalized grayscale signal voltage amplitude is 0.667 in FIG. 10 and (ii) the contribution rate of the increase in luminance will be increased as the normalized grayscale signal voltage amplitude increases.

In a case where the contribution rate of the increase in luminance (i.e., the lighting contribution) of the TFT 2 is approximately 50% when the normalization grayscale signal voltage amplitude is 1, the lightness index curve of L2* in FIG. 9 represents an approximately linear relation. Note that the characteristic would not be varied so much as long as the contribution rate of the increase in luminance is in a range between 45% and 55% when the normalized grayscale signal voltage amplitude is 1.

As described above, the characteristic can be realized by adjusting the parameters of the TFT 2 which linearly operates.

According to FIG. 8, a lightness index changes more smoothly in response to a change in luminance, provided that a current contribution (i.e., a lighting contribution) rate of the TFT 2 is 0% or more but less than 20% so that continuity of the luminance Yt is achieved within a range in which the normalized grayscale signal voltage amplitude is more than 0.333 but less than 0.667. This causes a reduction in unnatural display.

Moreover, when the normalized grayscale signal voltage amplitude is less than 0.333, the current contribution rate of the TFT 2 can be less than 20%.

According to the circuit configuration, a further light emitting current can be added, within an identical voltage range, to a conventional light emitting current which is in proportion to the square of the normalized grayscale signal voltage amplitude. This allows a high contrast display in the range between the low grayscale region and the peak grayscale region.

Note that, according to the above description, the grayscale luminance level is increased as the normalized grayscale signal voltage amplitude is increased. However, the concept of the present invention can be applied even in a case where the grayscale luminance level is increased as the grayscale signal voltage amplitude is decreased.

According to the circuit configuration, semiconductor elements such as the first semiconductor element 304 and the second semiconductor element 305 are employed as the switching elements. However, the switching elements are not necessarily be semiconductor elements, provided that switching elements are employed which have respective input signal versus light amount characteristics similar to the constant current characteristic of the TFT 1 and the linear current characteristic of the TFT 2. Alternatively, the switching elements can be solid thin films having an electrooptic transmittance characteristic and a light emitting characteristic which are similar to those described above.

According to the present embodiment, the organic light emitting diode is employed as the light emitting element 306. Instead of this, the light emitting element 306 can be an element whose transmittance is modulated in a transmissive liquid crystal pixel circuit. For example, the light emitting element 306 can be (i) a polarization film for electrically controlling a polarization direction of transmitted light or (ii) a solid thin film whose transmittance can be electrically changed. Alternatively, the light emitting element 306 can be an element which controls scattering directions of light by causing the light to be electrically refracted or reflected.

Such a light modulating element as described above can be an element which is capable of controlling light amount in combination with a semiconductor switch element.

The following describes Examples of the pixel circuit 1 and a display device including the pixel circuit 1.

EXAMPLE 1

Figure 2:
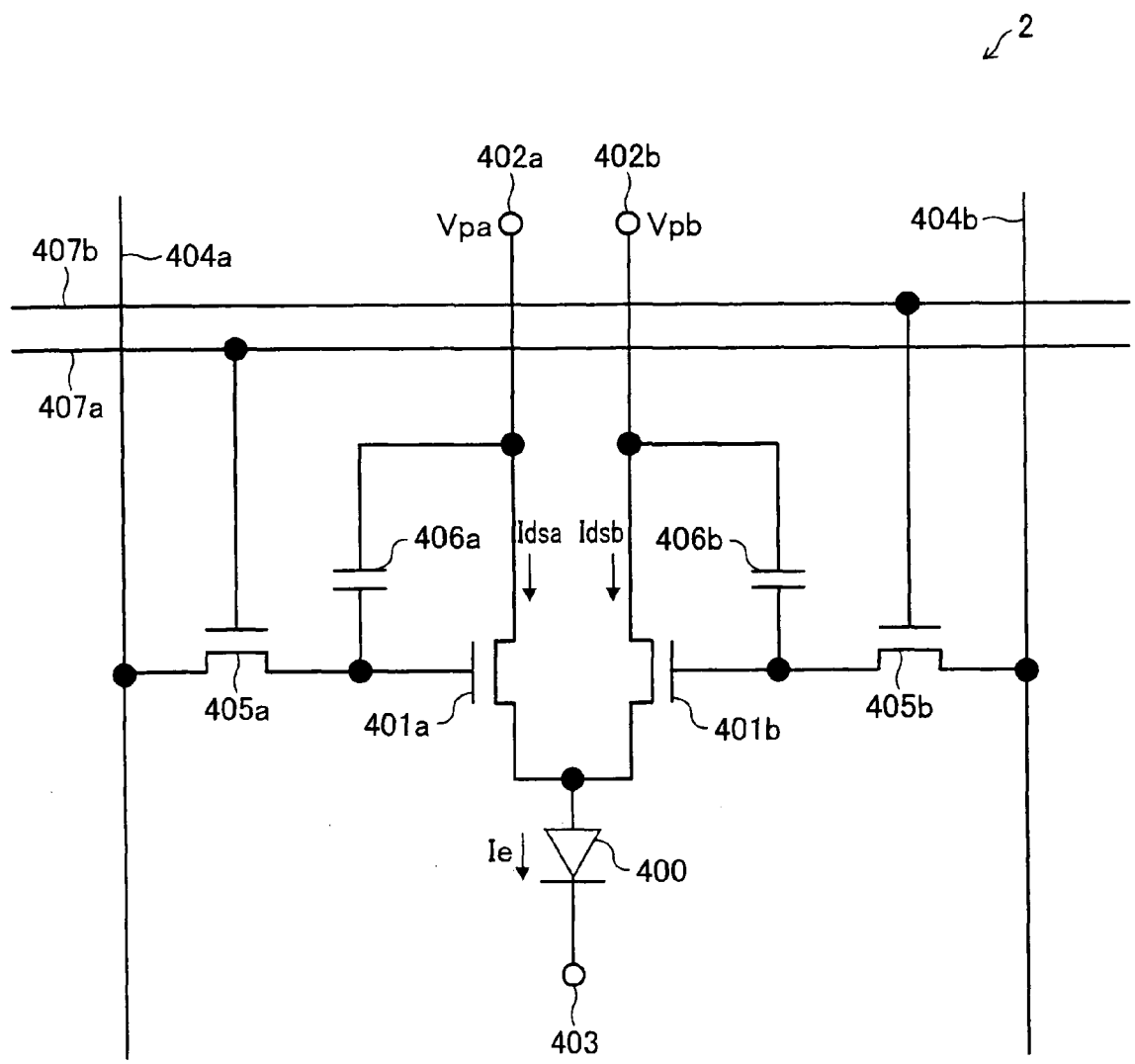
FIG. 2

FIG. 2 illustrates a circuit configuration of a pixel circuit 2 which is one example of the pixel circuit 1. According to FIG. 2, a TFT 401*a*, a TFT 401*b*, a light emitting element 400, a current supply voltage line 402*a*, a current supply voltage line 402*b*, and a common voltage supply line 403 correspond to the first semiconductor element 340, the second semiconductor element 305, the light emitting element 306, the power supply electrode 301, the power supply electrode 302, and the common electrode 303 shown in FIG. 1, respectively. In Example 1, it is assumed that all the TFTs used in the pixel circuit 2 are P-type TFTs.

One of input terminal of the light emitting element 400 is connected to drain terminals of the respective TFTs 401*a* and 401*b* one of which is connected in shunt with the other. The light emitting element 400 receives a light emitting current Ie which is a sum of a drain current Idsa of the TFT 401*a* and a drain current Idsb of the TFT 401*b*. Source terminals of the respective TFTs 401*a* and 401*b* are connected to the current supply voltage lines 402*a* and 402*b*, respectively. The other terminal of the light emitting element 400 is connected to the common voltage supply line 403.

A signal voltage is supplied from a data signal line 404*a* via a selection TFT 405*a* to a gate terminal of the TFT 401*a* serving as a light emitting current control element. A signal voltage is supplied from a data signal line 404*b* via a selection TFT 405*b* to a gate terminal of the TFT 401*b* serving as a light emitting current control element. A storage capacitor 406*a* is provided between the gate terminal and the source terminal of the TFT 401*a*, and a storage capacitor 406*b* is provided between the gate terminal and the source terminal of the TFT 401*b*. Moreover, selection signal electrodes 407*a* and 407*b* are connected to respective gate terminals of the selection TFTs 405*a* and 405*b*.

It is assumed that a gate channel size (a gate channel width Wa, a gate channel length La) of the light emitting current control TFT 401*a* and a gate channel size (a gate channel width Wb, a gate channel length Lb) of the TFT 401*b* satisfy an inequality (12).

$$Wa/La \leq Wb/Lb \qquad (12)$$

Note that, in a case where the TFT 401*a* is substituted with a circuit in which a plurality of TFTs are connected in parallel, each of the plurality of TFTs has an identical gate channel length La, and the channel width Wa is equal to a sum of gate channel widths of the plurality of TFTs.

A voltage Vpa of the current supply voltage line and a voltage Vpb of the current supply voltage line 402*b* satisfy an inequality (13).

$$Vpa \geq Vpb \qquad (13)$$

In case of satisfying the inequalities, (i) the TFT 401*a* generally operates, in a saturation characteristic region, in accordance with ranges of a gate signal voltage and a source-drain voltage, and (ii) the TFT 401*b* generally operates, in a linear characteristic region, in accordance with ranges of a gate signal voltage and a source-drain voltage. That is, while the TFTs 401*a* and 401*b* are tuning on, the light emitting element 400 receives (i) the drain current Idsa which is in proportion to the square of a change in gate voltage and (ii) the drain current Idsb which is in approximate proportion to a change in gate voltage.

Figure 3:
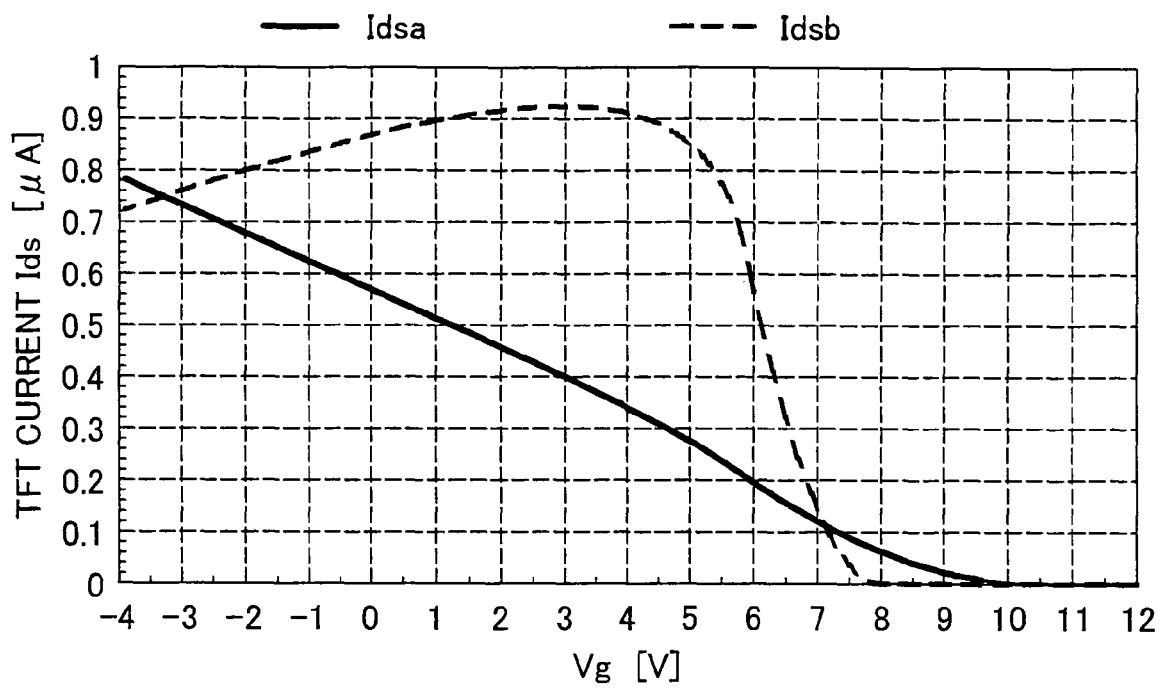
FIG. 3

According to the circuit configuration, a pixel current can be generated in accordance with voltage-current characteristics of the respective TFTs 401*a* and 401*b* (see FIG. 3). As is clear from FIG. 3, the drain current Idsa becomes generally predominant while a high gate voltage Vg is being supplied to the TFT 401*a*. This causes the light emitting element 400 to receive a light emitting current Ie which is in approximate proportion to the square of a change amount of the gate voltage. On the other hand, while a low gate voltage Vg is being supplied to the TFT 401b becomes low, the drain current Idsb becomes predominant. This causes a change in whole light emitting current Ie to become steeper than a change in the gate voltage.

Where a voltage Vs, at which a steep current change starts, should be set in a signal voltage range is determined in accordance with a design specification, provided that the following inequality (14) is satisfied, where Vtha represents a threshold voltage of the TFT 401a and Vthb represents a threshold voltage of the TFT 401b.

$$Vs < Vpb + Vthb < Vpa + Vtha \quad (14)$$

(Note that both Vtha and Vthb are negative values because the TFTs are P-type TFTs).

In a case where, for example, an upper limit of signal voltage amplitude is fixed, it is preferable that voltage amplitude ΔVn for displaying a normal grayscale and voltage amplitude ΔVp for displaying a peak grayscale can be set within a predetermined voltage output range ΔVout of a signal driver, etc. Accordingly, the characteristic can be easily designed by meeting requirements of the TFT and the power supply voltage as indicated by the following formula.

Maximum amplitude of a normal grayscale signal: ΔVn $$\Delta Vn = (Vpa + Vtha) - (Vpb + Vthb)$$

Voltage amplitude of a peak display grayscale signal: ΔVp $$\Delta Vn \le \Delta Vp \le \Delta Vout \quad (15)$$

According to the design, signal voltage amplitude which causes a maximum grayscale level (255 grayscale level in a case of 8-bit grayscale format) to be outputted in a normal grayscale display is set to ΔVn, and a peak grayscale is set so as to be displayed when a grayscale signal voltage amplitude is ΔVn or more.

As described above, the light emitting current Idsb is added to the light emitting current Idsa while a gate voltage causing a sufficient high grayscale display is being applied. Accordingly, it is possible to obtain the light emitting current Ie of larger than that obtained by only a TFT 401a.

Figure 5:
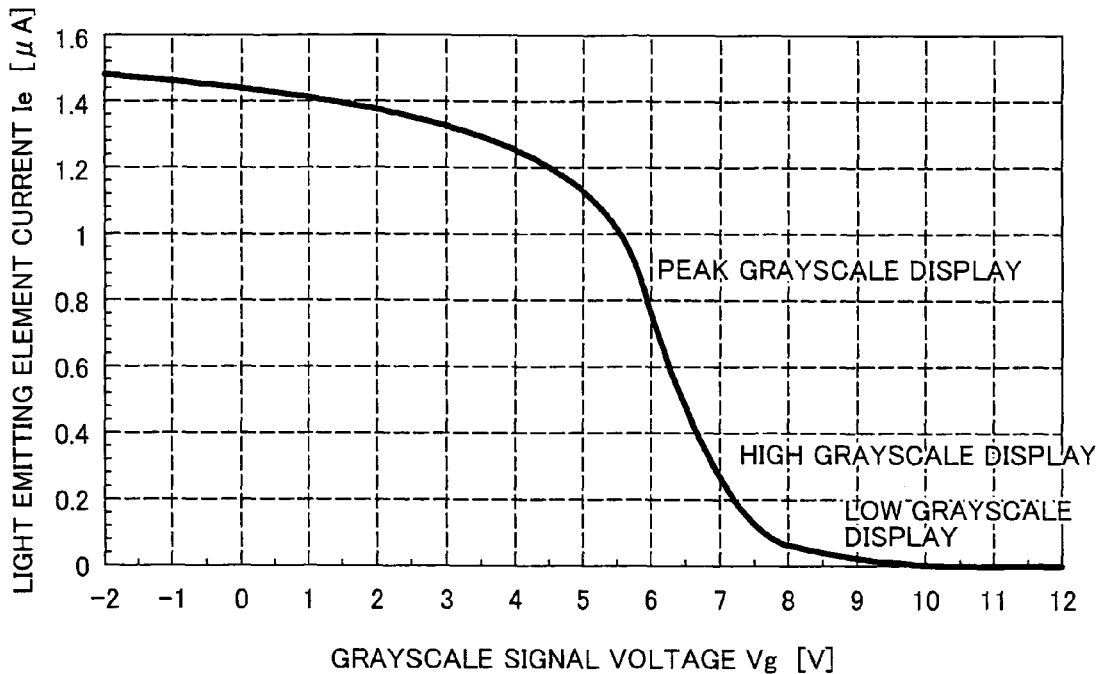
FIG. 5

FIG. 5 illustrates an Ie-Vg characteristic in the pixel circuit 2. According to the present circuit configuration: the grayscale signal voltage Vg of around 10V corresponds to a dark grayscale level; the grayscale signal voltage Vg in a range of approximately 8V to 10V for a low grayscale display; the grayscale signal voltage Vg of near 7V corresponds to a high grayscale display; and the grayscale signal voltage Vg of less than 7V corresponds to a peak grayscale display. This allows a current to be steeply changed.

EXAMPLE 2

Figure 4:
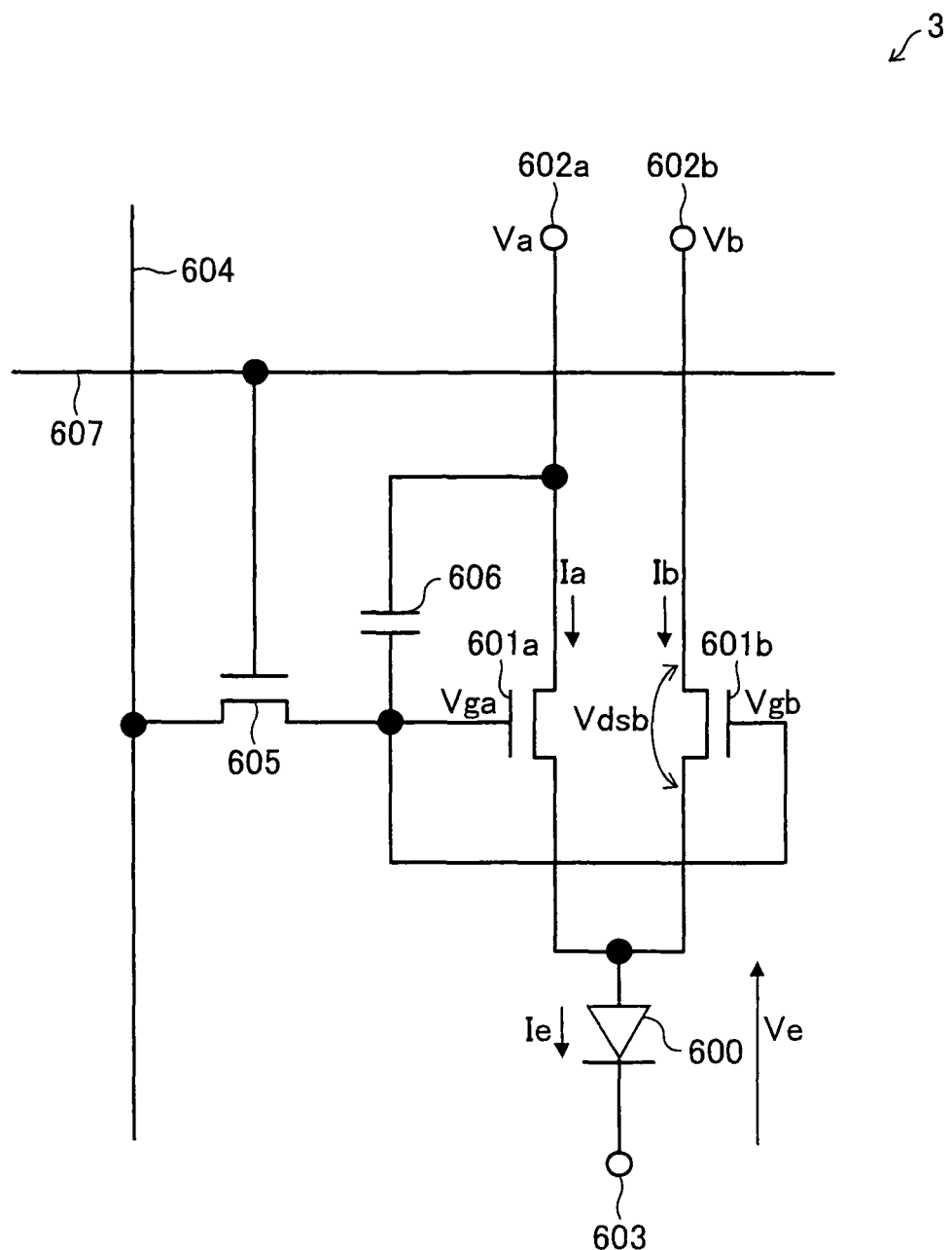
FIG. 4

FIG. 4 illustrates a circuit configuration of a pixel circuit 3 which is another example of the pixel circuit 1. Unlike the pixel circuit 2 shown in FIG. 2, in the pixel circuit 3 each of a storage capacitor, a data signal line, and a selection signal line is shared. According to FIG. 4, a TFT 601a, a TFT 601b, a light emitting element 600, a current supply voltage line 602a, a current supply voltage line 602b, and a common voltage supply line 603 correspond to the first semiconductor element 304, the second semiconductor element 305, the light emitting element 306, the power supply electrode 301, the power supply electrode 302, and the common electrode 303 shown in FIG. 1, respectively. It is assumed that all the TFTs used in the pixel circuit 3 are P-type TFTs.

One of input terminal of the light emitting element 600 is connected to drain terminals of the respective TFTs 601a and 601b one of which is connected in shunt with the other. The light emitting element 600 receives a light emitting current Ie which is a sum of a drain current Ia of the TFT 601a and a drain current Ib of the TFT 601b. Source terminals of the respective TFTs 601a and 601b are connected to the current supply voltage lines 602a and 602b, respectively. Further, the other terminal of the light emitting element 600 is connected to the common voltage supply line 603.

A signal voltage is supplied from a data signal line 604 via a selection TFT 605 to gate terminals of the TFTs 601a and 601b serving as light emitting current control elements. A storage capacitor 606 is provided between the gate terminal and the source terminal of the TFT 601a. Moreover, a selection signal electrode 607 is connected to a gate terminal of the selection TFT 605.

Note that relations of (i) a size ratio between the TFTs 601a and 601b and (ii) a current supply voltage, and (iii) an operation voltage range of each of the TFTs 601a and 601b are similar to those in Example 1 so that the TFTs 601a and 601b correspond to the TFTs 401a and 401b in Example 1, respectively.

In case of satisfying the condition, (i) the TFT 601a generally operates, in a saturation characteristic region, in accordance with ranges of a gate signal voltage and a source-drain voltage, and (ii) the TFT 601b generally operates, in a linear characteristic region, in accordance with ranges of a gate signal voltage and a source-drain voltage. Moreover, in response to a change in gate voltage which causes the TFT to turn on, a light emitting current to be supplied from the TFT 601a to the light emitting element 600 is predominant in a low grayscale region. Further, in a higher grayscale region, a light emitting current from the TFT 601b and the light emitting current from the TFT 601a are added and supplied to the light emitting element 600.

A steeper current-voltage change thus occurs in a high grayscale region. This makes it possible to carry out a glittering display.

Note that, according to the Examples 1 and 2, the light emitting current controlling TFTs are P-type TFTs. However, N-type TFTs or a combination of N-type and P-type of TFTs can be employed in line with the gist of the present invention. Note however that, since the elements of P-type and the N-type have respective different operation polarities, polarities of reference voltages in the above described formulae need to be corrected in accordance with their corresponding polarities.

According to the present embodiment, (i) two or more TFTs connected in parallel with each other which operate in a linear characteristic region and (ii) two or more TFTs connected in parallel with each other which operate in a saturation characteristic region can be provided for controlling the light emitting current of the light emitting element.

Drain terminals or source terminals of the respective TFTs which operate in a linear characteristic region and in a saturation characteristic region can be made up of an identical conductive material so as to be connected with each other.

According to the present embodiment, a compensation circuitry for nonuniformity can be further provided together with (i) a circuit configuration in the pixel circuit or (ii) a circuit configuration outside of the pixel, for compensating, among pixels, nonuniformity of operating characteristics of the TFT for controlling the light emitting current.

More specifically, such a compensation circuitry includes means for reducing nonuniformity of light emitting currents among different pixels. With the means, nonuniformity of displays is reduced to such a level and below that the nonuniformity of displays cannot be recognized from a predetermined viewing distance. Note that such nonuniformity of displays is caused due to nonuniformity of light emitting currents attributed to different TFT characteristic parameters such as threshold characteristic and a mobility characteristic of TFTs of the respective pixels.

The following description discusses a relation between a voltage range and luminance which are achieved in a case where any of the pixel circuits of the Examples is employed.

In a case of the pixel circuit 3 shown in FIG. 4, for example, the TFTs 601a and 601b are P-type semiconductors. Accordingly, the drain currents Ia and Ib of the TFTs 601a and 601b generally satisfy the following equation (16) while the TFTs 601a and 601b are turning on.

$$Ia=\beta a(Va-Vga+Vtha)^2 \text{ (in saturation characteristic region)}$$

$$Ib=\beta b(Vb-Vgb+Vthb-Vdsb/2)Vdsb \text{ (linear characteristic region)} \quad (16)$$

In the equation (16), Va and Vb are voltage sources which supply the drain currents of the respective TFTs 601a and 601b, and therefore indicate the source voltages of the respective TFTs 601a and 601b. Vga and Vgb indicate gate voltages of the respective TFTs 601a and 601b. Vtha and Vthb (i) indicate threshold voltages of the respective TFTs 601a and 601b, and (ii) satisfy a threshold relation described above. Vdsb indicate a voltage between the drain and the source of the TFT 601b. The gate voltages Vga and Vgb are a shared voltage, and therefore satisfy the relation Vgb=Vga.

The light emitting current Ie of the light emitting element 600 generally satisfies the following equation (17). While the light emitting element 600 is being driven, the light emitting current, indicated by equation (17), which is the sum of the currents Ia and Ib is supplied to the light emitting element 600.

$$Ie = K(Ve - Vthe)^2 \quad (17)$$
$$= Ia + Ib$$

In the equation, K represents a proportional constant indicative of a characteristic of the light emitting element 600, Ve represents a voltage across the light emitting element 600, and Vthe represents a threshold voltage of the light emitting element 600. Note that the voltage Vdsb and the voltage Ve satisfy the following equation (18).

$$Vb=Vdsb+Ve \quad (18)$$

FIG. 5 illustrates how a light emitting current Ie of the pixel circuit 3 changes in response to a change in the grayscale signal voltage Vg (horizontal axis). The power supply voltage Va is 12 V, a power supply voltage Vb is 9 V, and the threshold voltages Vtha, Vthb, and Vthe of the TFT 601a, the TFT 601b, and the light emitting element 600 are—1.5 V, −1.0 V, and +0.8 V, respectively.

In view of the inequality (14), the voltage Vs, at which the steep current change starts in FIG. 5, is approximately 8.0 V, and a signal voltage level which causes zero grayscale is 10.5 V. It follows that the signal voltage amplitude is set so that the steep current change occurs when the signal voltage amplitude is 2.5 Vpp or more, provided that the signal voltage of the grayscale level 0 has a signal voltage amplitude of zero.

The gate channel has a size so that (i) a ratio of a gate width W and a gate length L of the TFT 601a satisfies Wa/La=4 μm/75 μm and (ii) a ratio of a gate width W and a gate length L of the TFT 601b satisfies Wb/Lb=4 μm/5 μm. The light emitting current Ie is set to approximately 130 nA during a high grayscale level (a grayscale level 255 in a case of 8-bit grayscale format) of a normal grayscale display.

Figure 6:
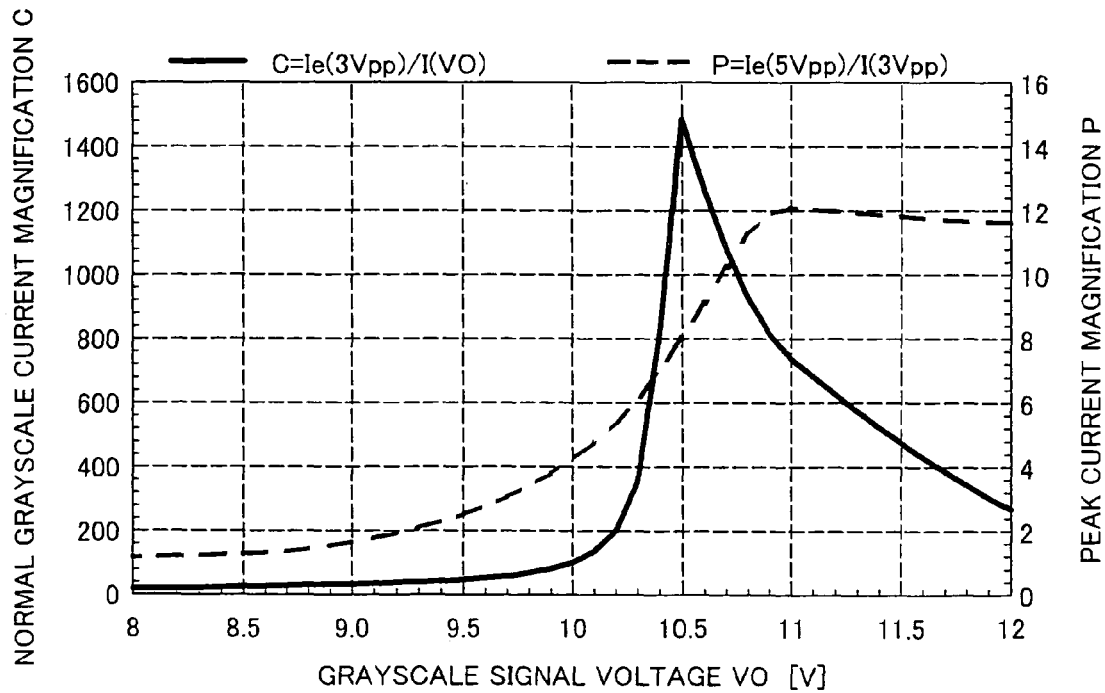
FIG. 6

FIG. 6 illustrates a normal grayscale current ratio C and a peak current ratio P that are found based on the following equations (19), on the condition that maximum amplitude of a grayscale signal voltage during a peak grayscale display is 5 Vpp and a grayscale amplitude range in a normal grayscale range is a maximum of 3 Vpp.

Normal grayscale current ratio $C=Ie(3Vpp)/Ie(Vo)$

Peak current ratio $P=Ie(5Vpp)/Ie(3Vpp)$ \quad (19)

In the equations (19), Vo in the function of Vo represents a signal voltage which causes a dark grayscale display under driving conditions. For example, 3 Vpp causes a high grayscale display whose maximum grayscale amplitude is 3 Vpp from the dark grayscale level.

As is clear from FIG. 5, the light emitting current Ie is increased steeply as the signal voltage changes from a dark grayscale level to a high grayscale level. This is because a contribution of the drain current Ib in the equations (16) is increased as the signal voltage is changed toward a signal voltage for a higher grayscale display. A display to which the drain current Ib contributes will become a high grayscale display part which is perceived as glittering and which is expressed by a bright dot, etc.

FIG. 3 illustrates how a source-drain current of each of the TFTs 601a and 601b is changed in response to a gate signal voltage. The drain currents Idsa and Idsb in FIG. 3 correspond to the drain currents Ia and Ib, respectively. The currents Ia and Ib are as follows, in a case where a gate voltage of 7.5 V is supplied, with amplitude of 3 Vpp from 10.5V for maximum grayscale level in a normal grayscale range.

Current Ie of the light emitting element 600: 126.7 nA
Current Ia of the TFT 601a: 90.2 nA, contribution ratio: 71.2%.
Current Ib of the TFT 601b: 36.5 nA, contribution ratio: 28.8%.

As is clear from the currents, a contribution of the current Ib of the TFT 601b is 28.8% in case of a maximum grayscale level in the normal grayscale display range, that is, in a case of the signal voltage amplitude of 3 Vpp.

Note that the contribution of the current Ib of the TFT 601b occurs when a grayscale level is approximately 127, i.e., when signal voltage amplitude is 2.5 Vpp or more.

FIG. 6 illustrates what peak current magnification is caused by the above characteristic. As is clear from FIG. 6, in a case where a signal voltage Vo for a dark grayscale is 10.2 V or more, a sufficient contrast is achieved. This is because a current magnification C in the normal grayscale display defined by the equations (19) is 200 or more. As is clear from FIG. 6, the peak current magnification P is approximately 5 to 8 in a case where a signal voltage V0 for a dark grayscale changes within a range between 10.2 V through 10.5 V.

That is, under the voltage condition, in a case where a signal voltage for a dark grayscale is 10.5 V and a normal grayscale display range is 3 Vpp, a display whose peak luminance is 8 times as high as that obtained in a case where a normal grayscale display range is 5 Vpp can be carried out.

Figure 7:
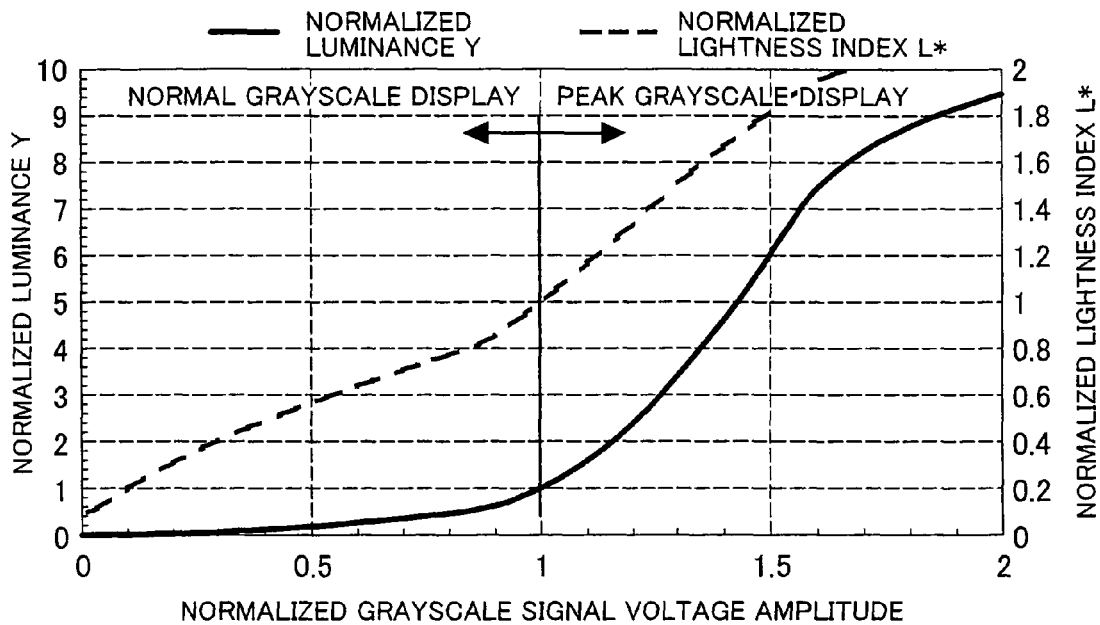
FIG. 7

FIG. 7 illustrates normalized luminance Y and a normalized lightness index L* which are normalized based on the light emitting current Ie.

As is clear from FIG. 7, a lightness index L* in a normal grayscale display range and a lightness index L* in a peak grayscale display range generally change in proportion to signal voltage amplitude, in a case where the contribution of the current Ib is 28.8% in the grayscale amplitude range of 3 Vpp. This makes it possible to provide a display device having a characteristic of high contrast display in a range between a low grayscale and a peak grayscale.

The following describes a pixel circuit of a comparative example for the present embodiment.

Figure 11:
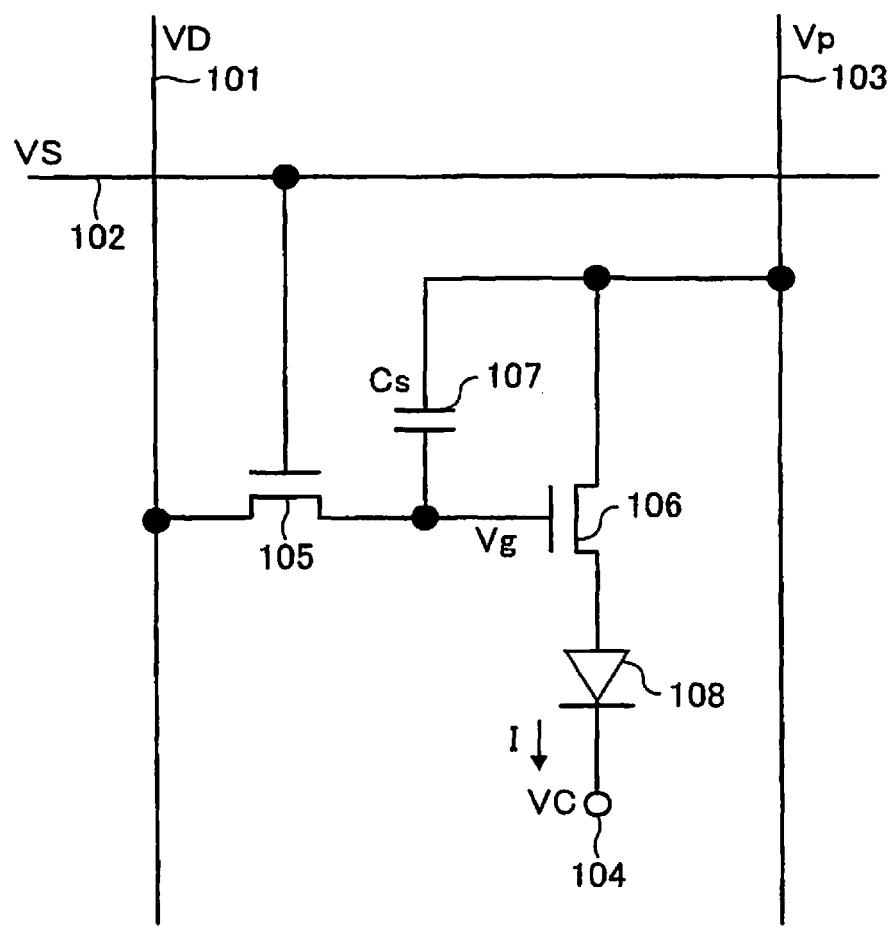
FIG. 11

FIG. 11 illustrates a conventional typical 2TFT1C pixel circuit. According to a circuit configuration illustrated in FIG. 11, a light emitting current I is supplied to the light emitting element 108 in response to the square of a change in gate voltage Vg of the TFT 106, in a case where the light emitting current I which flows from a current supply line 103 via which a power supply voltage Vp is supplied to a common voltage supply line 104 is obtained by causing a P-type driving TFT 106, which controls a current for driving the light emitting element 108, to operate in its saturation region. The gate voltage Vg is (i) supplied from a data signal line 101 to a storage capacitor 107 while a selection TFT 105 is turning on in response to a voltage VS which is applied to a selection signal electrode 102, and then (ii) held by the storage capacitor 107 while the selection TFT 105 is turning off in response to the voltage VS.

Figure 12:
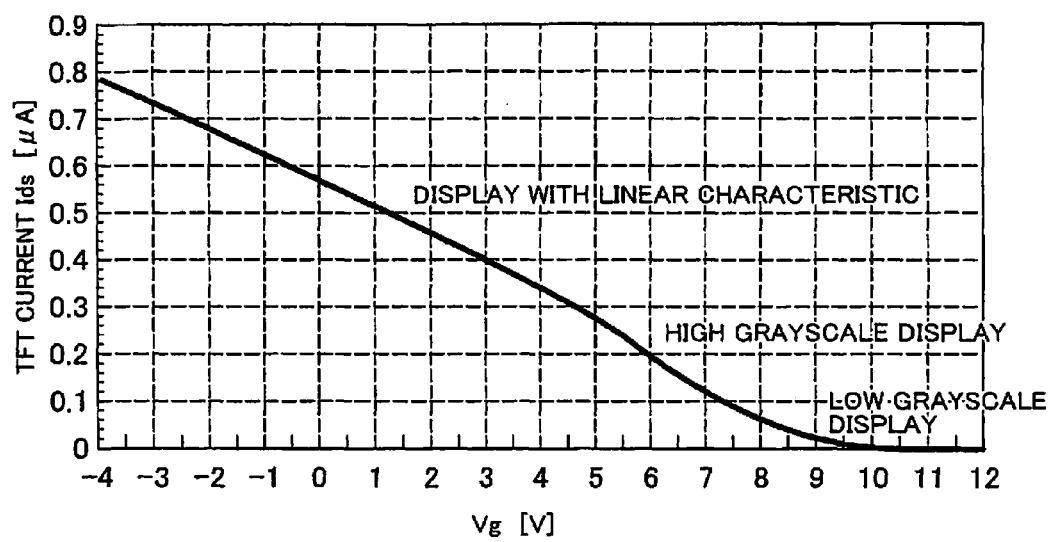
FIG. 12
Figure 13:
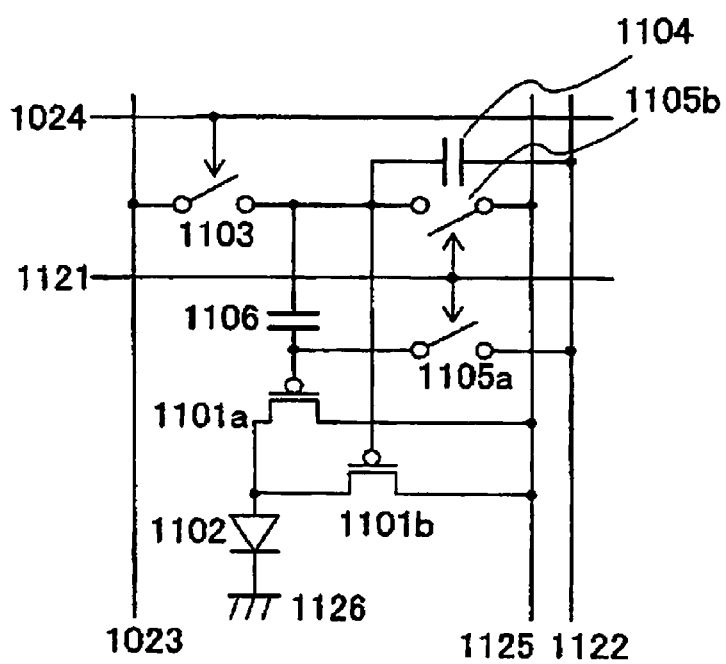
FIG. 13

FIG. 12 illustrates how a drain current Ids of the TFT 106, i.e., the light emitting current I changes, in the pixel circuit structure shown in FIG. 11, in response to a sweep of a gate signal voltage Vg. According to FIG. 12, the TFT 106 generally has a quadratic voltage-current characteristic when the gate signal voltage Vg is between 11 V and 6 V. The drain current Ids has substantially linear change when the gate voltage is approximately 5.5 V or less. This is because, as the gate signal voltage becomes lower, the light emitting element 108 gets closer to a high luminance voltage condition. This causes a gradual reduction in voltage between the drain and the source of the TFT 106, and ultimately causes the light emitting element 108 to operate in a linear characteristic region.

The light emitting current I is approximated by a voltage difference Vgs between a held gate voltage Vg and the source voltage Vs of the driving TFT 106 (see the following equation (20) indicative of a saturation characteristic).

$$I=\beta(Vgs-Vth)^2 \quad (20)$$

Note that inequalities Vgs≤Vth and Vds<<Vth are satisfied while the TFT 106 is turning on. This is because the TFT 106 is a P-type TFT. Note that the voltage difference Vds is a negative value because the power supply voltage Vp is supposed to be as a reference voltage. The value β (i) represents a parameter constant inherent in the TFT and (ii) includes parameters such as mobility, a gate channel size, and an electric capacitance between gate and silicon.

When a signal voltage V0 for dark level light emission is expressed by the following equations (21) as a voltage to be supplied, a signal voltage VL for a bright level can be expressed by the following equation (22). The ΔV corresponds to amplitude of a grayscale signal voltage.

$$Vgs=Vg-Vp$$

$$V0=Vg-Vp-Vth \quad (21)$$

$$VL=\Delta V+V0 \quad (22)$$

The light emitting current I expressed by the equation (20) can be simplified into a function of grayscale signal amplitude as expressed by the following equation (23).

$$I=\beta(\Delta V+V0)^2 \quad (23)$$

Note that when ΔV≈0 is satisfied, I≈0 is to be satisfied accordingly. The light emitting current I is supplied to the light emitting element at a level at which the light emitting current I does not contribute to a visible light emission.

Assuming that (i) ΔVn indicates a signal voltage range within which a display can be carried out in a normal grayscale level range and (ii) ΔVp indicates a signal voltage range within which a display can be carried out in a higher grayscale level range, a peak luminance magnification P is in approximate proportion to a light emitting current. As such, the peak luminance magnification P can be expressed by the following equation (24) with the use of the equation (23).

$$P=\{(\Delta Vp+V0)/(\Delta Vn+V0)\}^2 \quad (24)$$

In the equation (24), V0 indicates a voltage around a threshold voltage. A ratio of (i) a light emitting current I obtained when the gate voltage Vg is ΔVn+V0 to (ii) a light emitting current I obtained when the gate voltage Vg is V0, is at least 100. The following equation (25) is an equation for solving ΔVn.

$$\Delta Vn=\{\Delta Vp+(1-P^{1/2})V0\}/P^{1/2} \quad (25)$$

According to the equation (25), in a case where a normal signal driver is supposed to have maximum output amplitude of 5 Vpp, ΔVn becomes a maximum when ΔVp=5V. In a case where twofold or threefold larger peak current magnification is required, it is necessary to set, on the assumption that V0=1.5V, a signal voltage range for a normal grayscale display as follows:

in a case of the twofold:

$$\Delta Vn = 3.536 - 0.293 \cdot V0$$

$$= 3.097$$

in a case of the threefold:

$$\Delta Vn = 2.887 - 0.423 \cdot V0$$

$$= 2.253$$

These indicate that the voltage range for carrying out a normal grayscale display is narrower than that in Example 1.

According to the above example, when the normal grayscale signal voltage amplitude is approximately 3.1 V, at most twofold peak magnification is obtained in the maximum signal voltage amplitude range of 5 Vpp. On the other hand, according to the configuration of Example 1, when the normal grayscale signal voltage amplitude range is 3 Vpp, a sixfold peak magnification can be obtained in the maximum signal voltage amplitude range of 5 Vpp.

Moreover, in a case where V0≈0, when the normal grayscale signal voltage amplitude range is set to 3 Vpp in the equation (24), the peak luminance magnification P is 2.78, which is approximately half of that in Example 1.

EXAMPLE 3

Figure 14:
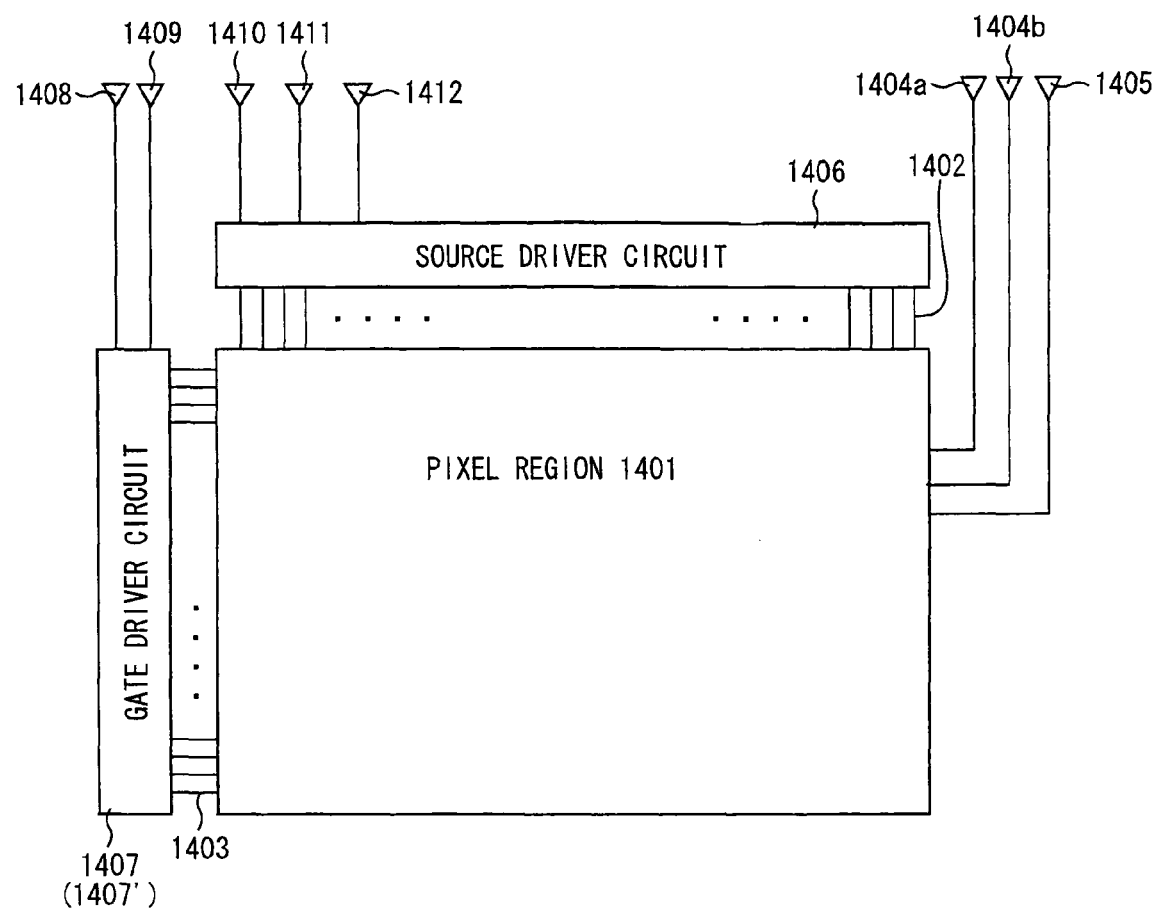
FIG. 14

FIG. 14 illustrates a structure of a display device in which the present invention is incorporated. The display device shown in FIG. 14 includes a source driver circuit (grayscale signal supply circuit section) 1406, a gate driver circuit (pixel selection signal circuit section) 1407, and a pixel region 1401 in which a plurality of pixel circuits each shown in FIG. 4 are provided in a matrix manner.

In the pixel region 1401, a grayscale signal line (data signal line) 1402 (604), a line selection signal line (scan signal line)

1403 (607), a power supply line (first power supply line) 1404a (602a), a power supply line (second power supply line) 1404b (602b), and a power supply line 1405 (603) are provided all together and extend outside the pixel region 1401. Note that the parenthesized numerals and symbols indicate reference signs of the corresponding components shown in FIG. 4.

The source driver circuit 1406 provided outside the pixel region 1401 includes: a plurality of register circuits which temporarily store received grayscale signals; a plurality of sample hold circuits; a buffer circuit which amplifies signal intensity; and the like. The source driver circuit 1406 supplies a held voltage to the grayscale signal line 1402 at predetermined timing.

The gate driver circuit 1407 includes a shift register, a buffer circuit which amplifies signal intensity, and the like. Outputs of rows are connected to the respective line selection signal lines 1403 in the pixel region 1401, and signal voltages are outputted in tern for turning on or off respective gate circuits in the pixel at predetermined timing. The gate drive circuit 1407 is connected to a plurality of control signal lines 1408 and a plurality of power supply lines 1409, and receives pulse voltage signals, DC voltage signals, or the like.

The source driver circuit 1406 is connected to a plurality of grayscale signal lines 1410 and a plurality of control signal lines 1411, and receives pulse signal voltages, DC voltages, or the like. Further, the source driver circuit 1406 is connected to a power supply line 1412 through which a power supply voltage is supplied. Note that signals supplied through the grayscale signal lines 1410 can be pulse voltage signals or analog voltage signals.

A power supply voltage supplied to the power supply lines 1404a, 1404b, and 1405 in the pixel region 1401 can have a voltage value either the same as or different from (i) that of a voltage supplied to the plurality of power supply lines 1412 connected to the source driver circuit 1406 or (ii) that of a voltage supplied to the plurality of power supply voltage lines 1409 connected to the gate driver circuit 1407.

The following describes display operation of a display device having the configuration.

The source driver circuit 1406 receives gray scale signals for pixels on a single row within a predetermined period. For example, under a condition of VGA with 480 pixels per column and 640 pixels per row, a scanning period for a single row is approximately 34.72 μs when 60 frames are displayed per second. During the period, a grayscale signal voltage for the 640 pixels per row (actually, a grayscale signal voltage for 1920 pixels since a single pixel generally includes subpixels of RGB) is stored in the source driver circuit 1406.

Then, in sync with output timing of the gate driver circuit 1407, the voltage stored in the source driver circuit 1406 is supplied to all the grayscale signal lines 1402 concurrently. In a pixel corresponding to a row on which a selection signal is being supplied for turning on the gate driver circuit 1407 on the row, a selection TFT 605 is being turned on so that a storage capacitor 606 inside the pixel receives the grayscale signal voltage supplied from the source driver circuit 1406. In response to the voltage supply, conductive states of the TFTs 601a and 601b serving as driving TFTs are controlled in accordance with the grayscale signal voltage. Accordingly, the light emitting element 600 carries out lighting in accordance with its degree of conductance.

When the on-selection signal being supplied from the gate driver circuit 1407 is switched to an off-selection signal, the selection TFT 605 in the pixel is turned into a nonconductive state and the grayscale signal voltage level is maintained in the storage capacitor 606.

The gate driver circuit 1407 outputs an on-selection signal to the other row in response to a timing signal, and thereafter, similar operation is repeated in turn.

On a row, light emission is maintained at the voltage level held by the storage capacitor 606 until a next scan is carried out.

As described above, the display device having the pixel circuit of the present invention is driven.

Note that, according to the above description, each source driver circuit 1406 and each gate driver circuit 1407 are paired. However, for example, a display with a similar property can be carried out by a combination of a plurality of driver circuits for carrying out split-screen scanning.

The pixel circuit in the pixel region 1401 can be used in any form as long as the pixel circuit can achieve the function of the present invention. Depending on a configuration of the pixel, in addition to the gate driver 1407, a gate driver circuit 1407' can be provided for outputting a row selection signal at timing different from that of the gate driver 1407.

The above description discussed the present embodiment.

According to the embodiment, the first semiconductor element 304 and second semiconductor element 305 shown in FIG. 1 are made up of TFTs for example. However, the present invention is not limited to this but a general field effect transistor formed on a silicon substrate can be used. In general, MOS transistor can be used as the first semiconductor element 304 and the second semiconductor element 305. Moreover, the organic light emitting diode can be substituted with a general light emitting diode.

The present invention is not limited to the description of the embodiments above, but can be altered by a skilled person in the art within the scope of the claims. An embodiment derived from a proper combination of technical means disclosed in respective different embodiments is also encompassed in the technical scope of the present invention.

As described above, the pixel circuit of the present invention includes: a display element whose luminance is controlled by a supplied current; at least one first switching element section whose output current characteristic shows a saturation characteristic in response to an input variable serving as a grayscale signal; and at least one second switching element section whose output current characteristic shows a linear characteristic in response to an input variable serving as a grayscale signal, (i) a first current supply line which outputs a current determined by the at least one first switching element section and (ii) a second current supply line which outputs a current determined by the at least one second switching element section being combined, and then being succeeded by a current supply line of the display element.

According to the configuration, it is possible to provide a pixel circuit which can generate higher peak luminance while sufficiently securing a voltage range for carrying out an appropriate normal grayscale display within a predetermined driver output range.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below Industrial Applicability The present invention is especially suitably applicable to an active matrix display device with light emitting element array whose luminance is controlled by a current.

The invention claimed is:

1. A pixel circuit comprising:
a display element having a luminance based on a supplied current in a current supply line of the display element;
at least one first switching element section whose output current characteristic includes a saturation characteristic in response to an input variable serving as a grayscale signal, the at least one first switching element section configured to output a current in the saturation characteristic region; and
at least one second switching element section whose output current characteristic shows a linear characteristic in response to an input variable serving as a grayscale signal, the at least one second switching element section configured to output a current in the linear characteristic region,
(i) a first current supply line which outputs the current determined by the at least one first switching element section and (ii) a second current supply line which outputs the current determined by the at least one second switching element section being combined to form the current supply line of the display element and to supply the supplied current to the display element,
the at least one first switching element section including at least one thin film transistor having a gate terminal, a source electrode and a drain electrode, the drain electrode of the at least one thin film transistor of the at least one first switching element section connected to an input terminal of the display element, the at least one thin film transistor of the at least one first switching element section configured to generate a first conducting current between the drain electrode of the at least one thin film transistor of the at least one first switching element section and the source electrode of the at least one thin film transistor of the at least one first switching element section that changes in proportion to a square of a voltage difference between the gate terminal of the at least one thin film transistor of the at least one first switching element section and the source electrode of the at least one thin film transistor of the at least one first switching element section,
the at least one second switching element section including at least one thin film transistor having a gate terminal, a source electrode and a drain electrode, the drain electrode of the at least one thin film transistor of the at least one second switching element section connected to the input terminal of the display element, the at least one thin film transistor of the at least one second switching element section configured to generate a second conducting current between the source electrode of the at least one thin film transistor of the at least one second switching element section and the drain electrode of the at least one thin film transistor of the at least one second switching element section that changes in proportion to a voltage difference between the source electrode of the at least one thin film transistor of the at least one second switching element section and the drain electrode of the at least one thin film transistor of the at least one second switching element section, and
the supplied current to the display element being a sum of a current outputted from the at least one first switching element section and a current outputted from the at least one second switching element section.

2. The pixel circuit as set forth in claim 1, wherein:
each of the at least one first switching element section and the at least one second switching element section is (i) made up of a single semiconductor element having two or more terminals or is (ii) made up of a circuit in which a plurality of semiconductor elements are connected in parallel with each other.

3. The pixel circuit as set forth in claim 1, wherein:
each of the at least one first switching element section and the at least one second switching element section is (i) made up of the at least one thin film transistor having three or more terminals, or is (ii) made up of a circuit in which a plurality of thin film transistors including the at least one thin film transistor are connected in parallel with each other.

4. The pixel circuit as set forth in claim 3, wherein:
an identical voltage is supplied to each gate terminal of the at least one thin film transistors of the at least one first and second switching element sections.

5. The pixel circuit as set forth in claim 3, wherein:
a relation $W1/L1 \leq W2/L2$ is satisfied, where W1 and L1 respectively represent a total of gate channel width and each gate channel length of the at least one thin film transistor of the at least one first switching element section, and W2 and L2 respectively represent a total of gate channel width and each gate channel length of the thin film transistor constituting the at least one second switching element section.

6. The pixel circuit as set forth in claim 5, wherein:
the at least one thin film transistor of the at least one first switching element section and the at least one thin film transistor of the at least one second switching element section are P-type transistors;
the at least one thin film transistor of the at least one first switching element section and serving as a first thin film transistor, has a saturation characteristic with a threshold voltage Vth1 and generates an output current from a supply voltage V1 of a first power supply line;
the at least one thin film transistor of the at least one second switching element section and serving as a second thin film transistor, has a linear characteristic with the threshold voltage Vth2 and generates an output current from a supply voltage V2 of a second power supply line;
a current output terminal of the first thin film transistor and a current output terminal of the second thin film transistor are connected to one terminal electrode of the display element and the other terminal electrode of the display element is connected to a common electrode; and
a relation $V1+Vth1 \geq V2+Vth2$ is satisfied.

7. The pixel circuit as set forth in claim 6, wherein:
a relation $V1 \geq V2$ is satisfied.

8. The pixel circuit as set forth in claim 6, further comprising:
at least one third thin film transistor which is provided so as to electrically connect or disconnect a current to be supplied to the display element, the at least one third thin film transistor being provided on a current supply line made up of (i) a current supply line routed from the first power supply line to the common electrode via the at least one first switching element section and the display element and (ii) a current supply line routed from the second power supply line to the common electrode via the at least one second switching element section and the display element.

9. The pixel circuit as set forth in claim 3, wherein:
a non-lighting process in which the display element is used includes a process in which an initial voltage is applied to at least one of (i) the gate terminal of the at least one thin film transistor of the at least one first switching element section and (ii) the gate terminal of the at least one thin film transistor of the at least one second switching element section.

10. The pixel circuit as set forth in claim 1, wherein:
in a grayscale signal voltage amplitude range, having a grayscale range normalized so that: a normal grayscale range lies between 0 and 1; and a peak grayscale range lies more than 1, which is normalized so that grayscale signal voltage amplitude for displaying the normal grayscale range lies between 0 and 1 and grayscale signal voltage amplitude for displaying the peak grayscale range lies more than 1, (i) a light emission contribution ratio of the at least one second switching element section is 20% or more when the grayscale signal voltage amplitude is ⅔ or more and (ii) the light emission contribution ratio is increased in response to a change in grayscale signal voltage amplitude corresponding to an increase in display grayscale level.

11. The pixel circuit as set forth in claim 10, wherein:
a light emission contribution ratio of the at least one first switching element section is 45% or more but 55% or less when the normalized range of grayscale signal voltage amplitude is 1.

12. The pixel circuit as set forth in claim 10, wherein:
when the grayscale signal voltage amplitude is ⅓ or more but less than ⅔ in the grayscale signal voltage amplitude range, (i) a light emission contribution ratio of the at least one second switching element section is 0% or more but less than 20% and (ii) the light emission contribution ratio is increased in response to a change in grayscale signal voltage amplitude corresponding to an increase in display grayscale level.

13. The pixel circuit as set forth in claim 10, wherein:
when the grayscale signal voltage amplitude is less than ⅓ in the grayscale signal voltage amplitude range, (i) a light emission contribution ratio of the at least one second switching element section is 0% or more but less than 20% and (ii) the light emission contribution ratio is increased in response to a change in grayscale signal voltage amplitude corresponding to an increase in display grayscale level.

14. The pixel circuit as set forth in claim 1, wherein:
the display element is an organic light emitting diode.

15. A display device comprising:
a plurality of pixel circuits as set forth in claim 1;
a pixel selection signal circuit section which supplies a selection signal to the pixel circuit so as to permit the pixel circuit to receive the grayscale signal;
a grayscale signal supply circuit section which supplies the grayscale signal to the pixel circuit;
a first power supply line whose supply is used for generating an output current by the at least one first switching element section;
a second power supply line whose supply is used for generating an output current by the at least one second switching element section;
a scan signal line through which the selection signal supplied from the pixel selection signal circuit section is transmitted to the pixel circuit; and
a data signal line through which the grayscale signal supplied from the grayscale signal supply circuit section is transmitted to the pixel circuit.

16. A pixel circuit comprising:
a display element having a luminance based on a supplied current in a current supply line of the display element;
at least one first switching element section whose output current characteristic includes a saturation characteristic in response to an input variable serving as a grayscale signal, the at least one first switching element section configured to output a current in the saturation characteristic region; and
at least one second switching element section whose output current characteristic shows a linear characteristic in response to an input variable serving as a grayscale signal, the at least one second switching element section configured to output a current in the linear characteristic region,
(i) a first current supply line which outputs the current determined by the at least one first switching element section and (ii) a second current supply line which outputs the current determined by the at least one second switching element section being combined to form the current supply line of the display element and to supply the supplied current to the display element,
the at least one first switching element section including at least one thin film transistor having a gate terminal, a drain electrode and a source electrode, the source electrode of the at least one thin film transistor of the at least one first switching element section connected to an input terminal of the display element, the at least one thin film transistor of the at least one first switching element section configured to generate a first conducting current between the source electrode of the at least one thin film transistor of the at least one first switching element section and the drain electrode of the at least one thin film transistor of the at least one first switching element section that changes in proportion to a square of a voltage difference between the gate terminal of the at least one thin film transistor of the at least one first switching element section and the drain electrode of the at least one thin film transistor of the at least one first switching element section,
the at least one second switching element section including at least one thin film transistor having a gate terminal, a drain electrode and a source electrode, the source electrode of the at least one thin film transistor of the at least one second switching element section connected to the input terminal of the display element, the at least one thin film transistor of the at least one second switching element section configured to generate a second conducting current between the drain electrode of the at least one thin film transistor of the at least one second switching element section and the source electrode of the at least one thin film transistor of the at least one second switching element section that changes in proportion to a voltage difference between the drain electrode of the at least one thin film transistor of the at least one second switching element section and the source electrode of the at least one thin film transistor of the at least one second switching element section, and
the supplied current to the display element being a sum of a current outputted from the at least one first switching element section and a current outputted from the at least one second switching element section.

17. The pixel circuit as set forth in claim 16, wherein:
each of the at least one first switching element section and the at least one second switching element section is (i) made up of the at least one thin film transistor having three or more terminals, or is (ii) made up of a circuit in which a plurality of thin film transistors including the at least one thin film transistor are connected in parallel with each other.

18. The pixel circuit as set forth in claim 17, wherein:
a relation $W1/L1 \leq W2/L2$ is satisfied, where W1 and L1 respectively represent a total of gate channel width and each gate channel length of the at least one thin film transistor of the at least one first switching element section, and W2 and L2 respectively represent a total of gate channel width and each gate channel length of the thin film transistor constituting the at least one second switching element section.

19. The pixel circuit as set forth in claim 18, wherein:
the at least one thin film transistor of the at least one first switching element section and the at least one thin film transistor of the at least one second switching element section are N-type transistors;
the at least one thin film transistor of the at least one first switching element section and serving as a first thin film transistor, has a saturation characteristic in which a threshold voltage is Vth1 and generates an output current from a supply voltage V1 of a first power supply line;
the at least one thin film transistor of the at least one second switching element section and serving as a second thin film transistor, which has a linear characteristic in which the threshold voltage is Vth2 and generates an output current from a supply voltage V2 of a second power supply line;
a current output terminal of the first thin film transistor and a current output terminal of the second thin film transistor are connected to one terminal electrode of the display element and the other terminal electrode of the display element is connected to a common electrode; and
a relation $V1+Vth1 \geq V2+Vth2$ is satisfied.

20. The pixel circuit as set forth in claim 19, wherein:
a relation $V1 \leq V2$ is satisfied.

* * * * *